United States Patent
Kishino

(10) Patent No.: US 7,219,290 B2
(45) Date of Patent: May 15, 2007

(54) TURBO DECODER AND TURBO DECODING METHOD AND STORAGE MEDIUM WHERE THE METHOD IS STORED

(75) Inventor: Masahiko Kishino, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 724 days.

(21) Appl. No.: 10/416,458

(22) PCT Filed: Mar. 6, 2001

(86) PCT No.: PCT/JP01/01737

§ 371 (c)(1),
(2), (4) Date: May 12, 2003

(87) PCT Pub. No.: WO02/071625

PCT Pub. Date: Sep. 12, 2002

(65) Prior Publication Data

US 2004/0019843 A1    Jan. 29, 2004

(51) Int. Cl.
*H03M 13/00* (2006.01)
(52) U.S. Cl. .................. 714/755; 714/786; 714/780
(58) Field of Classification Search ................ 714/755, 714/792, 786, 780, 746, 752, 796, 794
See application file for complete search history.

(56) References Cited

U.S. PATENT DOCUMENTS 6,510,536 B1 *  1/2003  Crozier et al. .............. 714/755
6,526,538 B1 *  2/2003  Hewitt ....................... 714/780
6,615,385 B1    9/2003  Kim et al. ................... 714/758
6,671,852 B1 * 12/2003  Ariel et al. .................. 714/793
6,757,865 B1 *  6/2004  Nakamura et al. ........... 714/796
6,845,482 B2 *  1/2005  Yao et al. .................... 714/755

FOREIGN PATENT DOCUMENTS

| JP | 2000-165258 A | 6/2000 |
| JP | 2000-183758 A | 6/2000 |
| JP | 2000-216755 A | 8/2000 |
| JP | 2000-269934 A | 9/2000 |
| JP | 2001-36416 A | 2/2001 |
| JP | 2001-36481 A | 2/2001 |
| KR | 2000-0046034 A | 7/2000 |
| KR | 2001-0011736 A | 2/2001 |
| WO | 00/52832 | 9/2000 |

OTHER PUBLICATIONS

Chinese Office Action and English translation thereof mailed Sep. 16, 2005 in corresponding Chinese application No. 01822983.2.

(Continued)

*Primary Examiner*—Albert DeCady
*Assistant Examiner*—Fritz Alphonse
(74) *Attorney, Agent, or Firm*—Nixon & Vanderhye PC

(57) ABSTRACT

In order to implement fine control of iterations in an example turbo decoder, a selector and decoding calculator is adapted to be able to decode an input data sequence based on previous likelihood information input to a soft-decision decoder in the first half and new likelihood information obtained from the soft-decision decoder having implemented a decoding process using the likelihood information.

11 Claims, 17 Drawing Sheets

OTHER PUBLICATIONS

Korean Office Action and English translation thereof mailed Oct. 17, 2005 in corresponding Korean application No. 10-2003-7011637.

Wu et al, "A Simple Stopping Criterion for Turbo Decoding", IEEE Communications Letters, vol. 4, No. 8, Aug. 2000, pp. 258-260.

European Search Report mailed Jul. 4, 2005 in corresponding European application No. 01908358.3-2223-JP0101737.

Wu et al, "A Simple Stopping Criterion for Turbo Decoding", IEEE Communication Letters, IEEE Service Center, Piscataway, US, vol. 4, No. 8, Aug. 2000, pp. 258-260.

Matache et al, "Stopping Rules for Turbo Decoders", TMO Progress Report, No. 42-142, Aug. 15, 2000, pp. 1-22.

Berrou, "Near Optimum Error Correcting Coding and Decoding: Turbo-Codes", IEEE Transactions Communications, vol. 44, No. 10, Oct. 1966, pp. 1261-1271.

Isaka et al, "Fingerpost to Shannon Limit: 'Parallel Concatenated (Turbo) Coding', 'Turbo (iterative) decoding' and its Surrounding", Technical Report IT98-51, Dec. 1998 of the Institute of Electronics, Information and Communication Engineers.

English translation of the International Preliminary Examination Report mailed Feb. 14, 2002 in corresponding PCT Application No. PCT/JP01/01737.

Notification of Reasons for Refusal mailed Jul. 1, 2003 in corresponding Japanese Patent Application No. 11-338114.

* cited by examiner

TURBO DECODER AND TURBO DECODING METHOD AND STORAGE MEDIUM WHERE THE METHOD IS STORED

This application is the U.S. national phase of international application PCT/JP01/01737 filed 06 Mar. 2001, which designated the U.S.

TECHNICAL FIELD

The present invention relates to a turbo decoder and method for receiving turbo codes and performing error correction and a storage medium storing the method, and is directed to improvement of the error characteristics.

BACKGROUND ART

Conventionally, the turbo coding has drawn attention after its first introduction in 1993 because of its high coding gain, and its application to channel coding for next generation mobile communications systems and the like has been investigated.

The outline of the turbo codes is detailed, for example, in the literature (Claude Berrow 'Near Optimum error correcting coding And Decoding: Turbo codes', IEEE Transactions on Communications, Vol.44 No.10, Oct. 1996, pp. 1262–1271) and the literature (Motohiko Isaka/Hideki Imai 'Fingerpost to Shannon limit: "parallel concatenated (Turbo) coding", "Turbo (iterative) decoding" and its surroundings', Technical Report IT98-51 December 1998 of The Institute of Electronics, Information and Communication Engineers.

The features of the Turbo code are briefly listed below:
(i) A plurality of identical constituent encoders are concatenated in parallel or in series.
(ii) An interleaver is used to uncorrelate inputs of data sequences to individual encoders. An interleaver having a high randomizing performance is preferred.
(iii) At the decoder end, based on the soft-decision input data, soft-decision decoded data and its soft-decision likelihood data as to likelihood information are output.
(iv) At the decoder end, soft-decision likelihood data is used as renewal likelihood information to implement iterative decoding.

Soft-decision data implies a value, which is not binary data consisting of 1 and 0 but is represented by a particular number of bits. Soft-decision input data implies received soft-decision data. Soft-decision likelihood data implies the likelihood of data to be decoded in terms of soft-decision data. Soft-decision decoded data implies decoded data calculated based on the soft-decision input data and the soft-decision likelihood data.

The principle of turbo coding will be described briefly. Here, a typical configuration in which encoders are concatenated in parallel is assumed with a code rate of ⅓ and a constraint length K=3. FIG. 10 shows a configuration of the turbo encoder.

This turbo encoder is schematically configured of a recursive systematic convolutional (RSC) encoder 400, a recursive systematic convolutional encoder 410 and an interleaver 420.

RSC encoders 400 and 410 are encoders having an identical configuration for implementing recursive systematic convolution.

Interleaver 420 is a permuter which rearranges an input data sequence X to generate a data sequence X' consisting of the same elements but in a different order.

The operation of RSC encoders 400 and 410 will be described. As shown in FIG. 11, this encoder can be configured of two shift registers, i.e., registers 430 and two modulo adders 440.

The internal states (b1, b2) in this encoder are represented as the values in the shift registers, there being four internal states, namely internal state (00), internal state (01), internal state (10) and internal state (11). When an input is given, every state has two possible internal states to transfer.

FIG. 12 shows state transitions in RSC encoders 400 and 410.

For the internal state (00), if the input is 0, the internal state transfers to the internal state (00) and the code output is 0; and if the input is 1, the internal state transfers to the internal state (10) and the output code is 1.

For the internal state (01), if the input is 0, the internal state transfers to the internal state (10) and the code output is 0; and if the input is 1, the internal state transfers to the internal state (00) and the output code is 1.

For the internal state (10), if the input is 0, the internal state transfers to the internal state (11) and the code output is 1; and if the input is 1, the internal state transfers to the internal state (01) and the output code is 0.

For the internal state (11), if the input is 0, the internal state transfers to the internal state (01) and the code output is 1; and if the input is 1, the internal state transfers to the internal state (11) and the output code is 0.

The data sequence obtained by subjecting input data sequence X to convolutional coding through RSC encoder 400 is referred to as data sequence Y1. The data sequence obtained by subjecting input data sequence X', which has been obtained by interleaving input data sequence X through interleaver 420, to convolutional coding through RSC encoder 410 is referred to as data sequence Y2.

In other words, the first code sequence Y1 and the second code sequence Y2 are generated from input data sequence X. The RSC encoders output X, Y1 and Y2 in parallel.

When assuming that input data sequence X is (0,1,1,0,0,0,1) and the data sequence X' after interleaving by interleaver 420 is (0,0,1,0,1,0,1), the convolutional codes result in Y1 (0,1,0,0,1,1,1) and Y2 (0,0,1,1,0,1,1). The evolutions of the internal state transitions in RSC encoders are shown in FIGS. 13 and 14. FIG. 13 is a diagram showing the internal state transitions for Y1 and FIG. 14 is a diagram showing the internal state transitions for Y2. In FIGS. 13 and 14, the thick lines denote the evolutions of state transitions.

Next, the basic constructional example of a turbo decoder is shown in FIG. 15. Each of blocks 600, 610, 620, 630, denoted with Iteration 1 to Iteration n, constitutes one decoding unit. Here, "Iterations" shown as being connected from one to another, implies repeated operations of the processes.

FIG. 16 shows a decoding unit block, or a block diagram of the components for each Iteration process. This decoding unit block is comprised of soft-decision decoders 10 and 11, interleavers 20 and 21, a recovery interleaver 22 and decoding calculator 33. The likelihood information E to be input to the first block 600 has an initial value (0,0,0,0, . . . 0,0: value 0).

Soft-decision decoders 10 and 11 are decoders which output a soft-decision output based on a soft-decision input.

Interleavers 20 and 21 are permuters for implementing the same operation as the interleaver 420 used on the RSC encoder side.

Recovering interleaver 22 is a permuter for recovery of the original data sequence from the data sequence which was permuted by interleavers 20 and 21.

Decoding operation part 33 is a means for generating data after error correction.

The signals input to the block are received signal sequences (X, Y1, Y2) and likelihood information E of the signals. Of these, signals (X, Y1, E) constitute one set, and are supplied to soft-decision decoder 10, where the first error correction to the soft-decision soft output is implemented. This process executes the error correction process corresponding to the encoding in RSC encoder 400 so as to generate renewed likelihood information E1 as to each signal.

Next, the second soft-decision soft output error correction is implemented based on signals (X, Y2, E1), involving the renewed likelihood information E1. In this case, since permutation of data was performed by interleaver 420 before convolutional coding in RSC encoder 410 (see FIG. 10), the data of likelihood information E1 is permuted by interleaver 20 and data of signal X is permuted by interleaver 21, respectively, so as to produce new data sequences (X', E1'). These new data sequences (X', E1') are supplied to soft-decision decoder 11, where the error correction process corresponding to the encoding in RSC 410 is implemented so that renewed likelihood information E2 as to each signal is generated. Here, since the data sequences (X', E1') necessary for the error correction process corresponding to the encoding in RSC 410 for the next iterative process have been rearranged by interleaver 20 and interleaver 21, likelihood information E2 is processed through recovering interleaver 22 so that the data is rearranged and output as likelihood information E2'. The likelihood information E2' is used as the likelihood information when iterative operations are repeated.

At decoding calculator 33, decoded result X" at this point can be obtained.

Various possible techniques for decoding turbo codes can be considered but there are two dominant methods, namely, SOVA (Soft Output Viterbi Algorithm) which is characterized by outputting data as soft output based on the application of the Viterbi algorithm, and Log-MAP (Maximum A Posteriori Probability) which is an improvement in computational efficiency of the maximum likelihood decision method. Here, one computational example based on the Log-MAP process will be described.

To begin with, the following notations are used in the description:

m: internal state m': internal state (before transition)

$S_t$: internal state at time t $X_t$: output information at time t

X: estimated output $Y_t$: received data information at time t (a): $p_t(m|m')$: the probability of transition to internal state m from internal state m':

$$p_t(m|m')=P_r(S_t=m|S_t-1=m')$$

(b): $q_t(X|m, m')$: the probability that the output in the case of transition from internal state m' to m is X:

$$q_t(X|m, m')=P_r(X_t=X|S_t=m\ ;\ S_t-1=m')$$

(c): $R(Y_t, X)$: the probability that the transmitted data is X and the received data is $Y_t$.

(d): $\gamma_t(m, m')$: the probability of transition from internal state m' to m when the received data is $Y_t$:

$$\gamma_t(m, m') = \sum_X P_t(m|m') \cdot q_t(X|m, m') \cdot R(Y_t, X)$$

for all possible X.

(e): $\alpha_t(m)$: the probability of the internal state at time t is m:

$$\alpha_t(m) = \max_{m'}\{\alpha_{t-1}(m') + \gamma_t(m, m')\}$$

for all possible m'.

(f): $\beta_t(m)$: the probability of the internal state at time t is m:

$$\beta_t(m) = \max_{m'}\{\beta_{t+1}(m') + \gamma_{t+1}(m, m')\}$$

for all possible m'.

(g): $\sigma_t(m, m')$: the probability of internal state m' at time t transferring to m :

$$\sigma_t(m,m')=\alpha_{t-1}(m')+\gamma_t(m',m)+\beta_t(m)$$

Next, computational procedures will be described.

The above precomputable values, (a): $p_t(m|m')$ and (b): $q_t(X|m, m')$, should be determined or optimized in advance. Specifically, (a): $P_t(m|m')$ for the turbo encoder shown in FIG. 10 are given as the table 1 below.

TABLE 1

| For t = 1, | | | |
|---|---|---|---|
| $p_t(0\|0) = 0.5$, | $p_t(1\|0) = 0$, | $p_t(2\|0) = 0.5$, | $p_t(3\|0) = 0$, |
| $p_t(0\|1) = 0$, | $p_t(1\|1) = 0$, | $p_t(2\|1) = 0$, | $p_t(3\|1) = 0$, |
| $p_t(0\|2) = 0$, | $p_t(1\|2) = 0$, | $p_t(2\|2) = 0$, | $p_t(3\|2) = 0$, |
| $p_t(0\|3) = 0$, | $p_t(1\|3) = 0$, | $p_t(2\|3) = 0$, | $p_t(3\|3) = 0$, |
| For t = 2, | | | |
| $p_t(0\|0) = 0.5$, | $p_t(1\|0) = 0$, | $p_t(2\|0) = 0.5$, | $p_t(3\|0) = 0$, |
| $p_t(0\|1) = 0$, | $p_t(1\|1) = 0$, | $p_t(2\|1) = 0$, | $p_t(3\|1) = 0$, |
| $p_t(0\|2) = 0$, | $p_t(1\|2) = 0.5$, | $p_t(2\|2) = 0$, | $p_t(3\|2) = 0.5$, |
| $p_t(0\|3) = 0$, | $p_t(1\|3) = 0$, | $p_t(2\|3) = 0$, | $p_t(3\|3) = 0$, |
| For t > 2, | | | |
| $p_t(0\|0) = 0.5$, | $p_t(1\|0) = 0$, | $p_t(2\|0) = 0.5$ | $p_t(3\|0) = 0$, |
| $p_t(0\|1) = 0.5$, | $p_t(1\|1) = 0$, | $p_t(2\|1) = 0.5$ | $p_t(3\|1) = 0$, |
| $p_t(0\|2) = 0$, | $p_t(1\|2) = 0.5$, | $p_t(2\|2) = 0$, | $p_t(3\|2) = 0.5$, |
| $p_t(0\|3) = 0$, | $p_t(1\|3) = 0.5$, | $p_t(2\|3) = 0$, | $p_t(3\|3) = 0.5$, |

(b): $q_t(X | m, m')$

TABLE 2

| $q_t(0\|0,0) = 1$, | $q_t(1\|2,0) = 1$, |
|---|---|
| $q_t(1\|0,1) = 1$, | $q_t(0\|2,1) = 1$, |
| $q_t(1\|1,2) = 1$, | $q_t(0\|3,2) = 1$, |
| $q_t(0\|1,3) = 1$, | $q_t(1\|3,3) = 1$, |

$q_t(X | m, m') = 0$, for other than the above.

Here, X is considered only on the transmitted data information.

Next, for each piece of the received data, (c): $R(Y_t, X)$ is determined, and calculations of (d): $\gamma_t(m, m')$ and (e): $\alpha_t(m)$ are repeated for all the pieces of the received data. As to (c), for example, Gaussian distribution having a standard deviation σ may be assumed. The probability density function P(X) in this case is represented as the following equation and its graph is shown in FIG. 17. Here, m=−1 or +1.

$$P(X) = \frac{1}{\sqrt{2\pi\sigma^2}} e^{-\frac{(x-m)^2}{2\sigma^2}}$$

The first sequence 500 in FIG. 17 represents data $p(Y_t|X_t=-1)$ when the input data is 1(−1) and the second sequence 510 represents data $p(Y_t|X_t=+1)$ when the input data is 0(+1). The horizontal axis represents $Y_t$ values and vertical axis represents $p(Y_t|X_t=-1)$ and $p(Y_t|X_t=+1)$ values. The $R(Y_t, X)$ can be given by the following equation, taking these into consideration.

$$R(Y_t, X) = \log\left[\frac{p(Y_t|X_t=+1)}{p(Y_t|X_t=-1)}\right] = \log\left[\frac{\frac{1}{\sqrt{2\pi\sigma^2}}e^{-\frac{(Y_t-1)^2}{2\sigma^2}}}{\frac{1}{\sqrt{2\pi\sigma^2}}e^{-\frac{(Y_t+1)^2}{2\sigma^2}}}\right] = -\frac{1}{2}\left(\frac{Y_t-1}{\sigma}\right)^2 + \frac{1}{2}\left(\frac{Y_t+1}{\sigma}\right)^2 = \frac{2}{\sigma^2}Y_t$$

=$2Y_t$, when assuming σ=1.

For operation of (e): $\sigma_t(m)$, the initial values are σ0(0)=0, σ0(1)=−∞, σ0(2)=−∞ and σ0(3)=−∞.

Next, (f): $\beta_t(m)$ is determined based on the above $\sigma_t$ thus determined, and then (g): $\sigma_t(m, m')$ is calculated. Based on (g), the input data is guessed to compute a MAP estimate candidate. This process is repeated for all pieces of data.

The initial values for operation of (f) are $\beta_n(0)$=0, $\beta_n(1)$=−∞, $\beta_n(2)$=−∞ and $\beta_n(3)$=−∞.

For estimation of a MAP candidate, the following expression is calculated and used as the likelihood information for the decoder.

$$\log\left[\frac{\sum_{X_t=+1}\sigma_t(m,m')}{\sum_{X_t=-1}\sigma_t(m,m')}\right] = \max_{X_t=+1}\{\sigma_t(m,m')\} - \max_{X_t=-1}\{\sigma_t(m,m')\}$$

where Σ should be taken for all conceivable m and m'.

This can be derived using the following approximations in Log-MAP:

$$\cdot \log\left(\sum_i \exp(a_i)\right) \cong a_M \quad (a_M : \text{the maximum value among } a_i)$$

$\cdot\log(e^{P1} \cdot e^{P2})=P1+P2$ $\cdot\log(e^{P1}/e^{P2})=P1-P2$

In order to obtain error corrected final result, based on the likelihood information E1 from the anterior stage soft-decision decoder 10 and the likelihood information E2' result is generated.

The following formula (1) is used for calculation for the decoded result:-

$Lc \cdot X + E1 + E2'; \quad Lc \cong 4Ec/No = 2/\sigma^2$ \hfill (1)

The transmitted data can be guessed by checking the sign of the calculated result of the above formula (1). When the sign of the calculation is (+), it can be guessed as (+1) and when the sign is (−), it can be estimated as (−1).

FIG. 18 shows the error correction characteristics of this turbo coding.

In FIG. 18, BER (Bit Error Rate) characteristics are shown: no-coding 700 designates the case of no-coding; IT=1: 710 the case where one iteration is performed; IT=2: 720 the case where iterations are repeated twice; IT=3: 730 the case where iterations are repeated three times; IT=4: 740 the case where iterations are repeated four times; and IT=5: 750 the case where iterations are repeated five times.

Here, Viterbi: 760 shows the BER characteristics when 5 bit soft-decision Viterbi decoding (with a constraint length of 9, Rate=⅓) is implemented.

As seen in the BER characteristics in FIG. 18, according to the turbo coding, the more the number of iterations is increased, the more the error correction performance improves.

However, in the turbo coding, it is possible to improve error correction characteristics by performing iterations of decoding while the amount of processing increases, so that there is a limit to the number of iterations of decoding.

In one word, error correction performance is limited by the limitation of the amount of processing.

With the prior art error correction characteristics shown in FIG. 18, if a bit error rate of $10^{-6}$ needs to be achieved, Eb/No should be 3.0 for two times of iterations. For three times of iterations, Eb/No becomes 2.2 or lower. That is, the number of iterations is selected depending on the necessary error correction performance.

Accordingly, if iterations cannot be repeated three times from the viewpoint of the amount of processing, the number of iterations have to be set at 2, hence Eb/No becomes 3.0, resulting in relative degradation of error correcting performance.

The present invention has been devised in order to solve the above problem; it is therefore an object of the present invention to provide a turbo decoder which can implement fine control of iterations.

DISCLOSURE OF INVENTION

In order to attain the above object the present invention is configured as follows:

The first feature of the present invention resides in a turbo decoder which receives an information signal, a first additional signal and a second additional signal and generates likelihood data of decoded data obtained by a decoding process of the information signal, as previous likelihood data and iteratively decodes the information signal based on the previous likelihood data, comprising: a first decoding portion which implements a first decoding process of an information signal based on the information signal, a first additional signal and previous likelihood data, to output first likelihood data; and a decoding calculator which, based on the information signal, the previous likelihood data and the first likelihood data, implements a decoding process of the information signal to output decoded data.

In accordance with the first feature, since "the previous likelihood data" is used instead of "likelihood data at the posterior stage" to implement decoding calculation in the decoding calculator, it is possible to perform iterative decoding calculation at a time different from that of conventional systems or at finely controlled timing.

Specifically, in the prior art, the first decoder determines the anterior stage first likelihood data of the decoded data using the information signal, the first additional signal and the previous likelihood data, and implements a posterior stage decoding process using the first likelihood data, the information data and the second additional signal, determines "posterior stage likelihood data" of the decoded data, and implement decoding calculation using "the posterior stage likelihood data" or "the first likelihood data and posterior stage likelihood data". In contrast, in the first configuration, since decoding of the information signal is implemented using "the previous likelihood data and the first likelihood data", it is possible to implement decoding calculation by half the time duration of iterations of the prior art.

The second feature of the present invention resides in a turbo decoder which receives an information signal, a first additional signal and a second additional signal and generates likelihood data of decoded data obtained by decoding process of the information signal, as previous likelihood data and iteratively decodes the information signal based on the previous likelihood data, comprising: a first decoding portion which implements a first decoding process of an information signal based on the information signal, a first additional signal and previous likelihood data, to output first likelihood data; a first interleaver for permuting the first likelihood data in accordance with a predetermined rule and outputting permuted first likelihood data; a second interleaver for permuting the information signal in accordance with the predetermined rule and outputting a permuted information signal; a second decoding portion which implements a second decoding process of the information signal based on the permuted information signal, a second additional signal and the permuted first likelihood data, to output second likelihood data; a third interleaver for permuting the second likelihood data in accordance with a predetermined rule and outputting permuted second likelihood data; and a decoding calculator which, based on the information signal, the previous likelihood data and the first likelihood data, implements a decoding process of the information signal to output decoded data.

Next, the third feature of the present invention resides in the turbo decoder described in the second feature, characterized in that the decoding calculator can also output decoded data, decoded based on the information signal, the first likelihood data and the permuted second likelihood data.

In accordance with the second and third features of the present invention, since "the previous likelihood data" is used instead of "the permuted second likelihood data" or "posterior likelihood data" corresponding to the number of additional signals, to implement decoding calculation, it is possible to perform iterative decoding calculation at a time different from that of conventional systems or at finely controlled timing.

Specifically, in the prior art, decoding calculation of the information signal is implemented based on "the permuted second likelihood data", "posterior stage likelihood data", "the first likelihood data and the permuted second likelihood data" or the like. In contrast, in the second and third configurations, since decoding of the information signal is implemented using "the previous likelihood data and the first likelihood data", it is possible to implement decoding calculation by half the time duration of iterations of the prior art.

The fourth feature of the present invention resides in the turbo decoder described the second or third feature, characterized in that the permuted second likelihood data is used as the previous likelihood data for a subsequent process in the first decoding portion.

In accordance with the fourth feature, since "the previous likelihood data" is used instead of "the permuted second likelihood data" to implement decoding calculation, it is possible to perform iterative decoding calculation at a time different from that of conventional systems or at finely controlled timing, with a compact configuration.

The fifth feature of the present invention resides in the turbo decoder described in the second or third feature, characterized in that the first decoding portion is also used as the second decoding portion. Further, the sixth feature of the present invention resides in turbo decoder described in the second or third feature, characterized in that one interleaver is configured to serve as two or three of the first, second and third interleavers.

In accordance with the fifth and sixth features, since decoders and interleavers for implementing identical operations are combined for shared use, it is possible to provide a compact turbo decoder.

The seventh feature of the present invention resides in the turbo decoder described in the first, second or third feature, further comprising: a repetition count setter for setting the number of decoding processes to be repeated, wherein the decoding calculator outputs the decoded data of the information signal, after repeating the decoding processes the number of repetitions designated at the repetition count setter.

In accordance with the seventh feature, it is possible to set the number of iterations, it is possible to implement optimal control of error correction performance by taking into account the amount of processing.

The eighth feature of the present invention resides in a turbo decoding method which receives an information signal, a first additional signal and a second additional signal and generates likelihood data of decoded data obtained by a decoding process of the information signal, as previous likelihood data and iteratively decodes the information signal based on the previous likelihood data, comprising: a first decoding step of implementing a first decoding process of an information signal based on the information signal, a first additional signal and previous likelihood data, to output first likelihood data; a first permuting step of permuting the first likelihood data in accordance with a predetermined rule and outputting permuted first likelihood data; a second permuting step of permuting the information signal in accordance with the predetermined rule and outputting a permuted information signal; a second decoding step of implementing a second decoding process of the information signal based on the permuted information signal, a second additional signal and the permuted first likelihood data, to output second likelihood data; a third permuting step of permuting the second likelihood data and outputting permuted second likelihood data; and a decoding and calculating step of implementing a decoding process of the information signal to output decoded data, based on the information signal, the previous likelihood data and the first likelihood data.

According to the eighth feature, it is possible to implement decoding calculation by half the time duration of iterations of the prior art.

The ninth feature of the present invention resides in a storage medium, wherein the turbo decoding method defined in the eighth feature is stored.

According to the ninth feature, it is possible for a controller such as a CPU, DSP or the like to implement a turbo decoding process in a simple manner by storing the method of turbo decoding into a storage medium, for example, a semiconductor memory, rotating storage and the like. Accordingly, it is possible to implement general-purpose processing in various communication appliances.

BEST MODE FOR CARRYING OUT THE INVENTION

Now, the first embodiment of the present invention will be described in detail with reference to the drawings.

Figure 1:
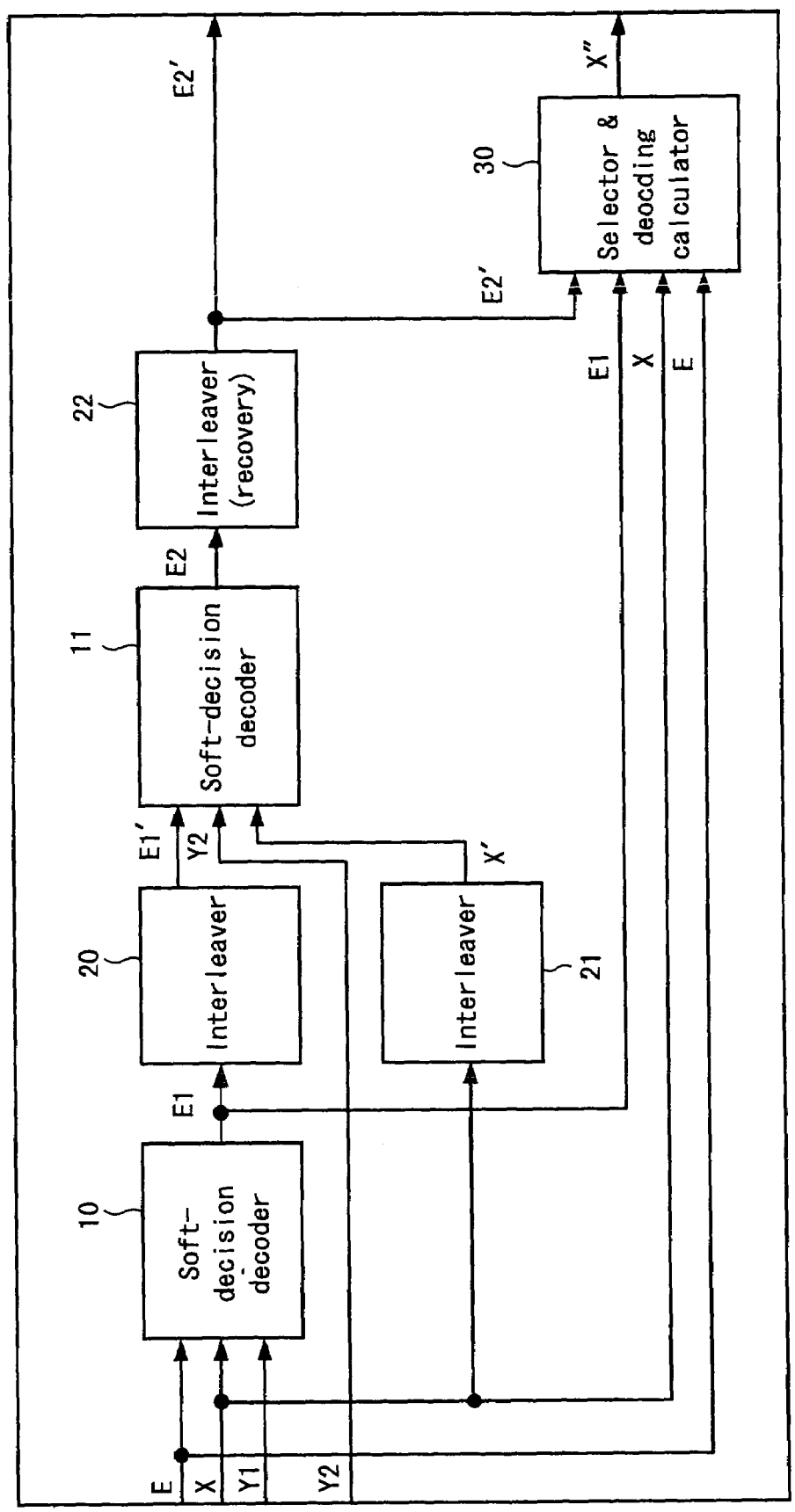
FIG. 1 is a block diagram showing a turbo decoder in accordance with the first embodiment of the present invention.

FIG. 1 is a block diagram showing a configuration of a turbo decoder in accordance with the first embodiment. Here, the same components as those described above are allotted with the same reference numerals and description is omitted.

The turbo decoder in accordance with the first embodiment includes soft-decision decoders 10 and 11, interleavers 20 and 21, a recovering interleaver 22 and a selector and decoding calculator 33.

Soft-decision decoders 10 and 11 are decoders which output soft-decision decoded data and soft-decision likelihood data based on a soft-decision input. Interleavers 20 and 21 are permuters for implementing the same operation as the interleaver 420 used on the RSC encoder side.

Recovering interleaver 22 is a permuter for recovery of the original data sequence from the data sequence which was permuted by interleavers 20 and 21.

Figure 2:
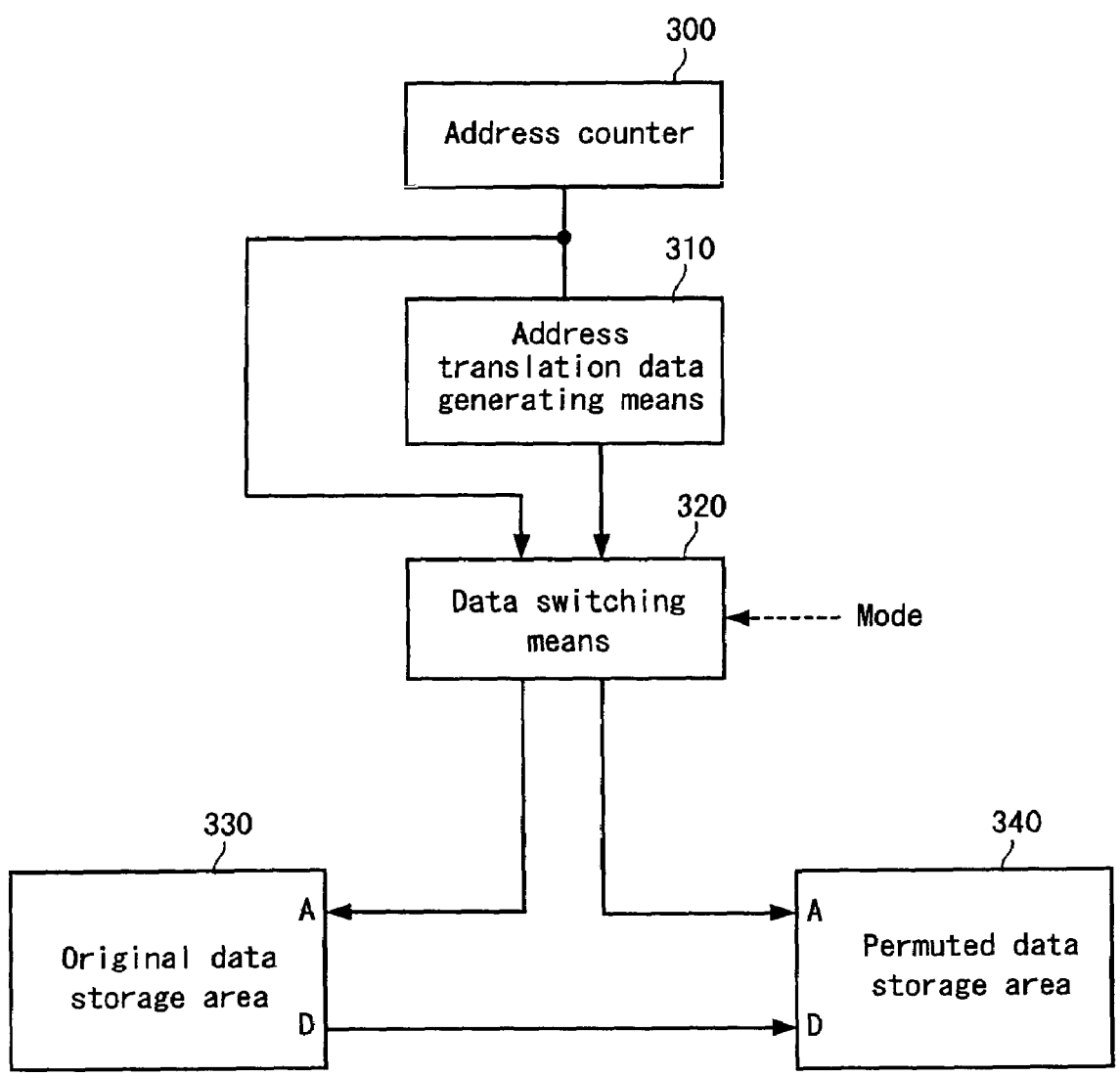
FIG. 2 is a block diagram showing a configuration of interleaving in turbo codes in accordance with the first embodiment of the present invention.

Referring to FIG. 2, the interleaving process by the interleaver will be described.

The interleaver is comprised of an address counter 300, an address translation data generating means 310 for generating translation data unique to the value of the address counter, a data switching means 320 for switching data depending on the mode state, an original data storage area 330 and a permuted data storage area 340.

Address translation data generating means 310 is realized by logical circuits or a configuration using a memory storing table data.

The mode signal applied to data switching means 320 is dependent on the operational status of turbo coding. When the operation is in the interleave mode, the value on address counter 300 is set as the address data for permuted data storage area 340 while the data output through address translation data generating means 310 is set into original data storage area 330. The data present in original data storage area 330 is mapped to different addresses to achieve interleaving.

Recovering interleaver 22 is a permuter for recovery of the original data sequence from the data sequence which was permuted by interleavers 20 and 21.

When the operation is in the recovering interleaver mode, the value on address counter 300 is set as the address data for original data storage area 330 while the data output through address translation data generating means 310 is set into permuted data storage area 340. That is, the flows of data are inverted from each other with respect to the interleave mode. Thus, permutation of the original data can be realized.

Selector and decoding calculator 30 is a decision and processor for selecting the necessary data and creating decoded data after error correction.

The decoding block (turbo decoder) has the received signal sequences (X, Y1, Y2) and likelihood information E of the signals as the input signals. Of these, signals (X, Y1, E) constitute one set, and are supplied to soft-decision decoder 10, where the first error correction to the soft-decision soft output is implemented. This process executes the error correction process corresponding to the encoding in RSC encoder 400 so as to generate renewed likelihood information E1 as to each signal.

Next, another soft-decision soft output error correction is implemented again based on signals (X, Y2, E1), involving the renewed likelihood information E1.

Figure 10:
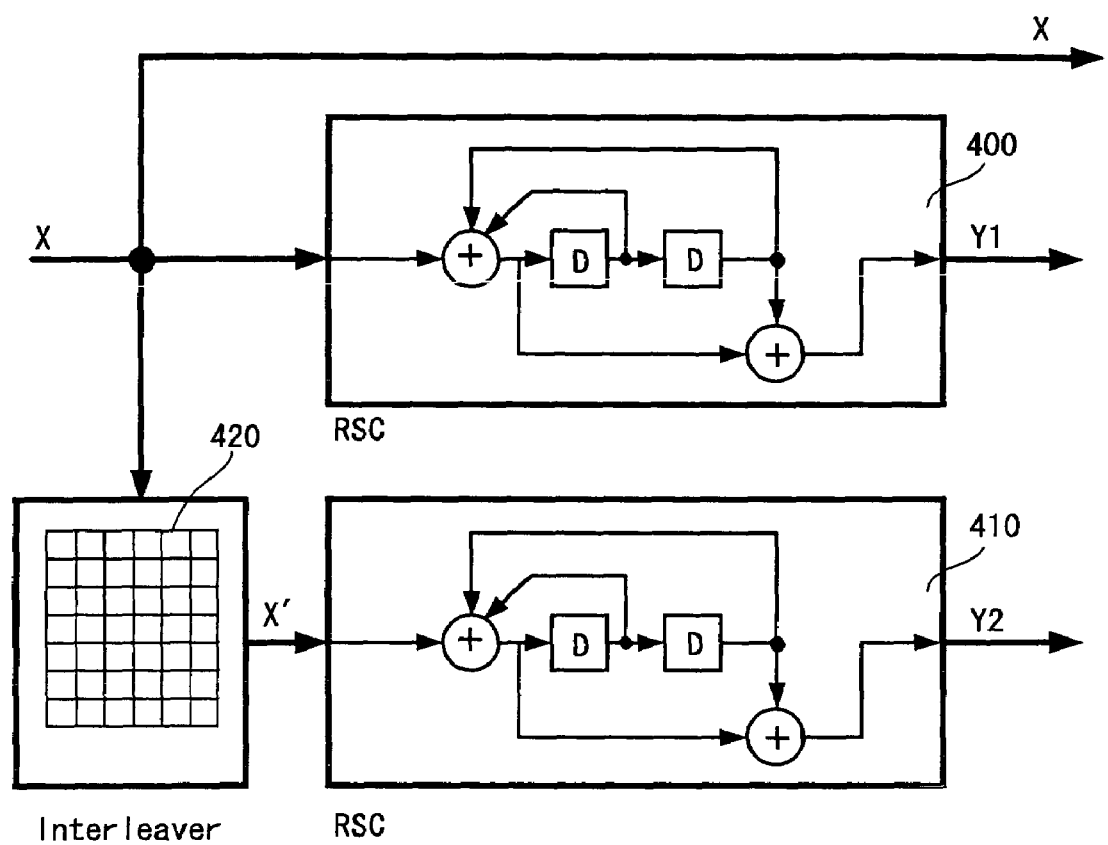
FIG. 10 is a block diagram showing a conventional turbo encoder.
Figure 11:
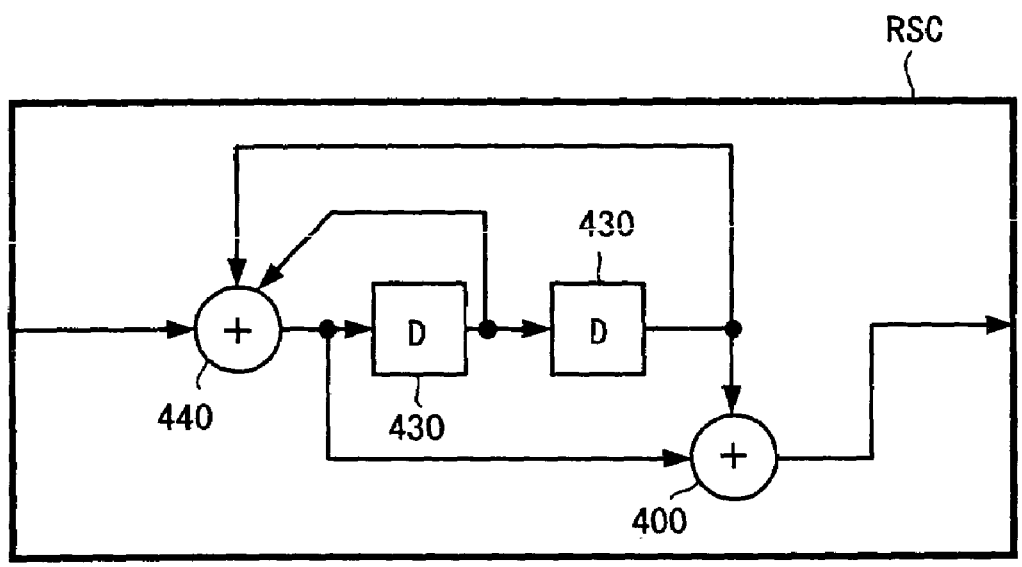
FIG. 11 is a block diagram showing a conventional RSC encoder.
Figure 12:
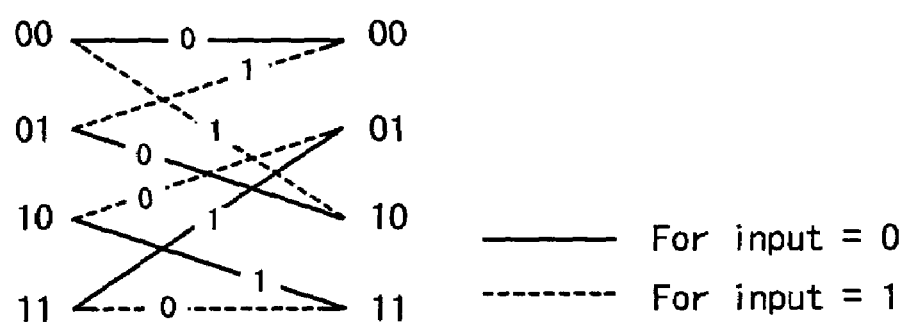
FIG. 12 is an illustrative chart showing state transitions in a conventional turbo encoder.
Figure 13:
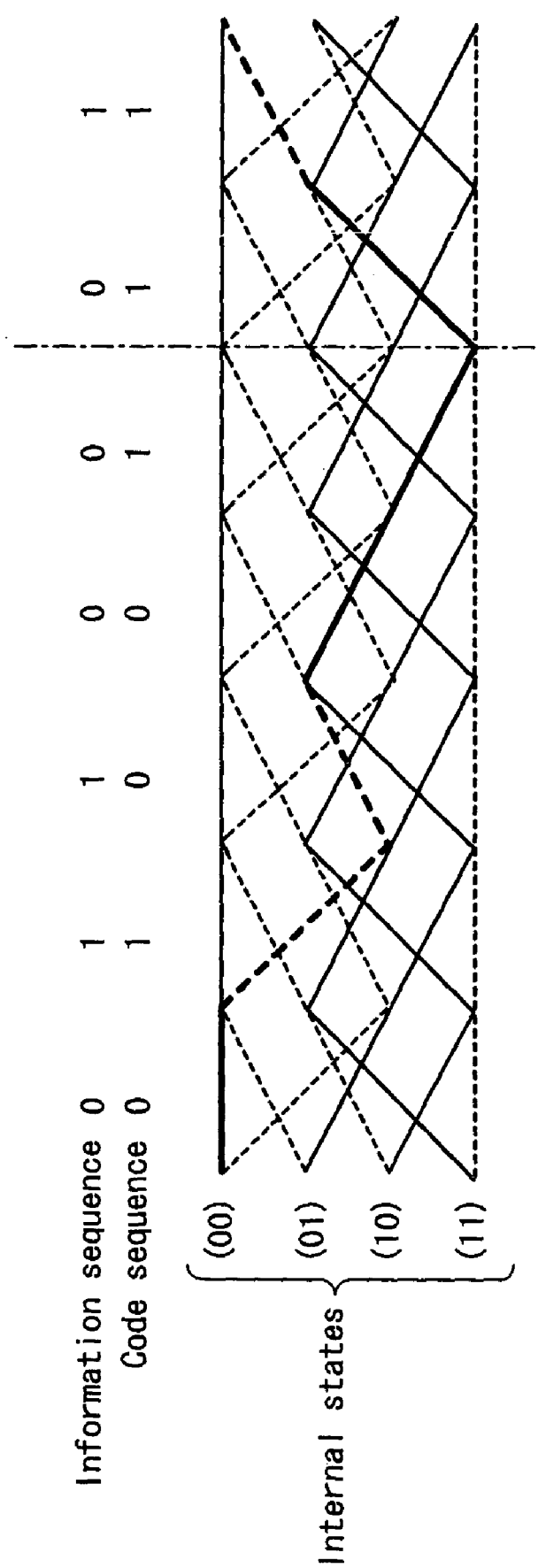
FIG. 13 is an illustrative chart showing state transitions in a conventional turbo encoder.
Figure 14:
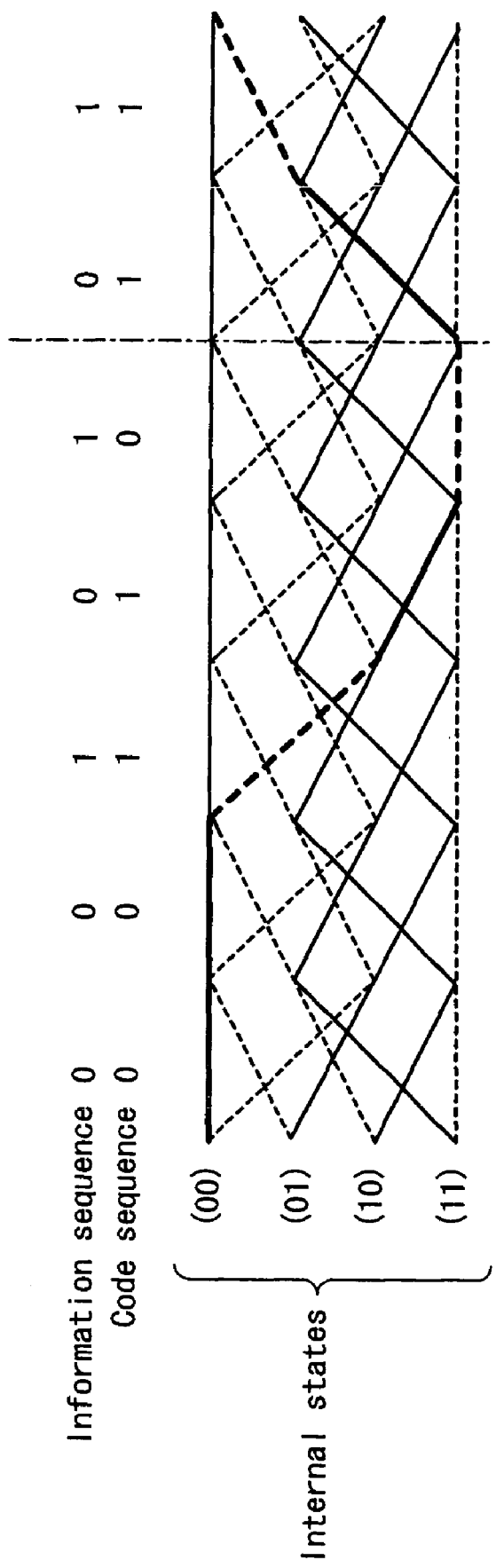
FIG. 14 is an illustrative chart showing state transitions in a conventional turbo encoder.
Figure 15:
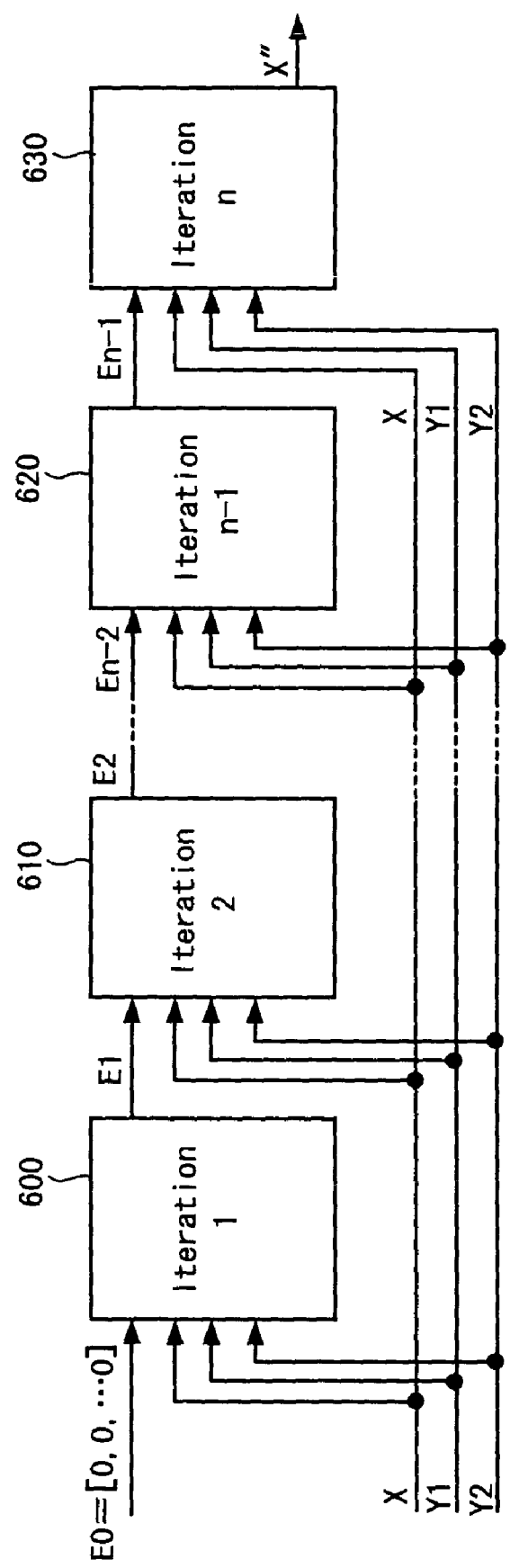
FIG. 15 is an illustrative diagram showing iterative operations in a conventional turbo decoding process.
Figure 16:
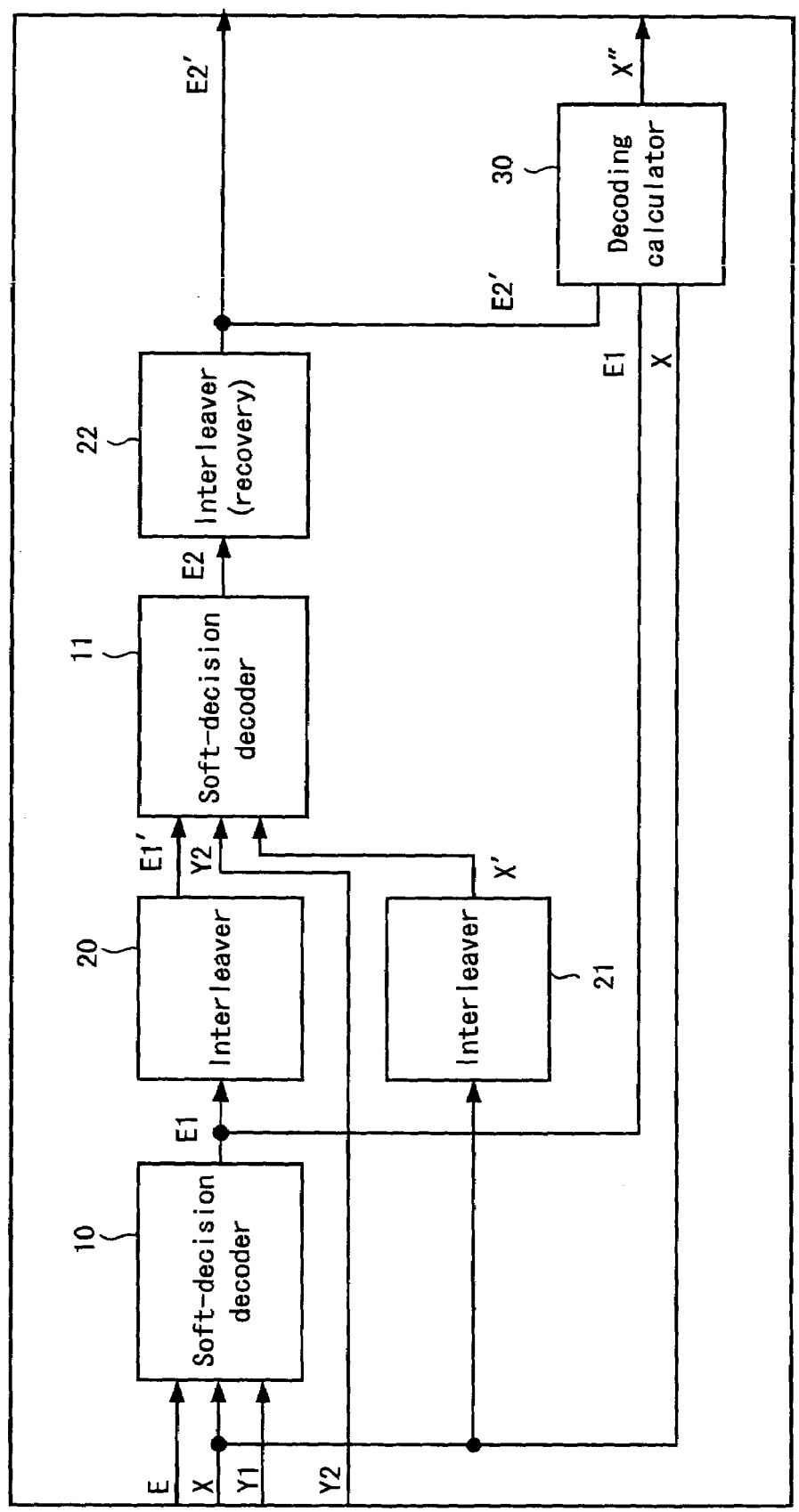
FIG. 16 is a block diagram showing a conventional turbo decoder.
Figure 17:
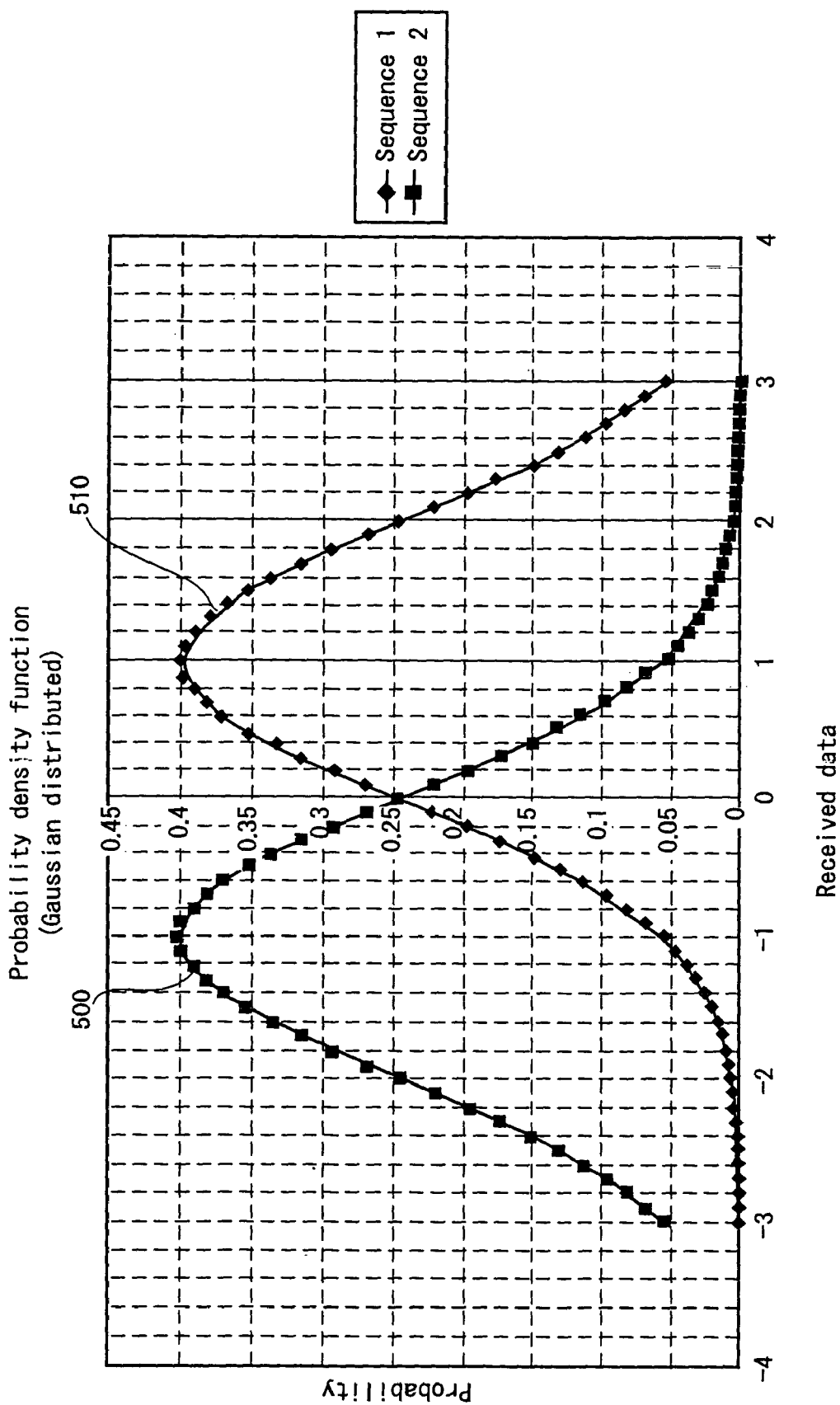
FIG. 17 is a chart showing a Gaussian distribution having a standard deviation σ.

Since permutation of data was performed by interleaver 420 before convolutional coding in RSC encoder 410 (see FIG. 10), the data of likelihood information E1 is permuted by interleaver 20 and data of signal X is permuted by interleaver 21, respectively, so as to produce new data sequences (X', E1'). These new data sequences (X', E1') are supplied to soft-decision decoder 11, where the error correction process corresponding to the encoding in RSC 410 is implemented so that renewed likelihood information E2 as to each signal is generated. Here, since the data sequences (X', E1') necessary for the error correction process corresponding to the encoding in RSC 410 for the next iterative process have been rearranged by interleaver 20 and interleaver 21, likelihood information E2 is processed through recovering interleaver 22 so that the data is rearranged and output as likelihood information E2'. The likelihood information E2' is used as the likelihood information when iterative operations are repeated.

In the present embodiment, in the unit block of an iterative operation, the likelihood information E of the signals to be input to the first soft-decision decoder 10 is adapted to be supplied to selector and decoding calculator 30. In this selector and decoding calculator 30, calculation defined by the following formula (2) can be implemented.

$$Lc \cdot X + E + E1 \quad (2)$$

E in this formula (2) is equivalent to E2' at the previous iteration.

Further, in the present embodiment, another decoding path, which is present in the conventional configuration, can be also selected, so that the calculation for decoding: (Lc·X+E1+E2') can be also implemented.

That is, in selector and decoding calculator 30, either (Lc·X+E1+E2') or (Lc·X+E+E1) can be selected as the decoded result. In the conventional example, only calculation (Lc·X+E1+E2') was possible as the decoded result, but the additional decoded result (Lc·X+E+E1) can be used in the first embodiment.

Figure 3:
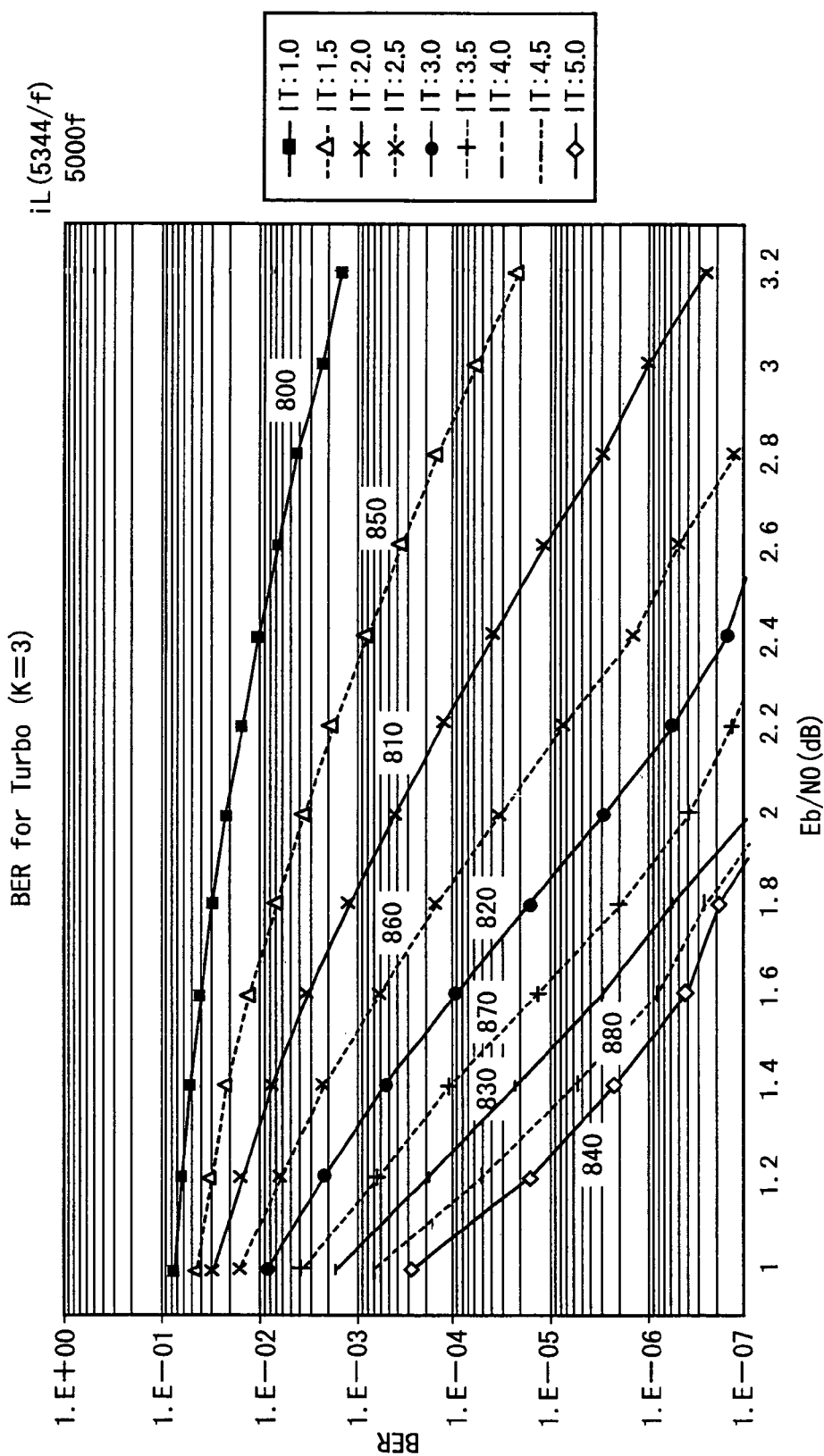
FIG. 3 is a block diagram showing a configuration of interleaving in turbo codes in accordance with the first embodiment of the present invention.

FIG. 3 shows the error correction characteristics in the first embodiment.

In this chart, IT=1: 800 designates the case where one iteration is performed; IT=2: 810 the case where iterations are repeated twice; IT=3: 820 the case where iterations are repeated three times; IT=4: 830 the case where iterations are repeated four times; and IT=5: 840 the case where iterations are repeated five times.

Further, IT=1.5: 850 designates the case where the second iteration is performed with (Lc·X+E+E1); IT=2.5: 860 the case where the third iteration is performed with (Lc·X+E+E1); IT=3.5: 870 the case where the fourth iteration is performed with (Lc·X+E+E1); and IT=4.5: 880 the case where the fifth iteration is performed with (Lc·X+E+E1).

As understood from FIG. 3, the error correction characteristics when the formula (Lc·X+E+E1) is used interpolate the error correction characteristics when the conventional formula (Lc·X+E1+E2') is used.

Accordingly, the options of the number of iterations are broadened compared to the conventional turbo decoding scheme, hence it is possible to select the optimal process with a more suitable number of iterations and error correction characteristics. As a result, it becomes possible to provide a turbo decoder capable of performing a finer control of iterations.

In the above embodiment, two identical soft-decision decoders 10 and 11 are used, but the same turbo decoding can be implemented with a single soft-decision decoder. This will be next described as the second embodiment.

The second embodiment of the present invention will be described with reference to FIG. 4. Here, the same components as those described above are allotted with the same reference numerals and description is omitted.

The turbo decoder in accordance with the present embodiment includes a soft-decision decoder 10, two interleavers 20 and 21, are covering interleaver 22, a selector and decoding calculator 130 and four input signal selecting means (SW) 120 to 123.

In the embodiment described above, in order for one soft-decision decoder 10 to achieve iterative decoding, input signal selecting means (SW) 120 to 123 are provided. Each signal selecting means (SW) is an electric conduction path changer circuit functioning as a so-called switch and changes conduction paths one from another based on control information from an unillustrated controller. For example, electrically controlled switches such as transistors etc., mechanically controlled switches can be selected as appropriate depending on the function and purposes.

Likelihood information E and the aftermentioned likelihood information E" are input to SW120, and one of these pieces of likelihood information is selected and output therefrom. Received signal X and an interleaved version X' of the received signal X after processing by interleaver 21 are input to SW121, and one of the two is selected and output therefrom. Received signals Y1 and Y2 are input to SW122, and one of the two is selected and output. Based on the signals selected and output from SW 120 to 122, soft-decision decoder 10 implements error correction of soft-decision soft output and supplies new likelihood information E' to interleaver 20 and recovering interleaver 22. Interleaved versions of the likelihood information processed through interleaver 20 and recovering interleaver 22 are input to SW123, and one of the two is selected and output as likelihood information E". This information E" is used as the input information to the aforementioned SW120 and selector and decoding calculator 130.

In the first half of the decoding in each iterative process, SW120 selects likelihood information E from the likelihood information E and E" and outputs it. SW121 selects received information X from received information X and X' and outputs it. SW122 selects parity information Y1 from the parity information Y1 and Y2 and outputs it.

As a result, likelihood information E from external source and information bits X and Y1 from external source are used in soft-decision decoder 10. The output likelihood information E' is permuted by interleaver 20 and then is output as likelihood information E" from SW123.

In the second half of the decoding in each iterative process, SW120 selects likelihood information E" from the likelihood information E and E" and outputs it. SW121 selects an interleaved version X' of the received information from received information X and X' and outputs it. SW122 selects Y2 from the parity information Y1 and Y2 and outputs it.

As a result, likelihood information E" form external source and information bits X' and Y1 from external source are used in soft-decision decoder 10. The output likelihood information E' is rearranged by de-interleaver 22 to the original order and then is output as likelihood information E" from SW123.

With the above arrangement, the value (Lc·X+E'+E"), determined based on E' in the first half operation part and the output E" from the de-interleaver in the second half decoding and the value (Lc·X+E+E'), determined based on the input information sequence E in the first half operation part and the output E' from the first half decoding can be obtained as the decoded results, from selector and decoding calculator 130, whereby it is possible to improve the error correction performance while suppressing increase in the amount of processing or enlargement of the circuit scale. As a result, compared to the conventional configuration, a higher integration, hence reduced power consumption can be realized if equivalent error characteristics are demanded. If equivalent circuit scales are expected, error correction of a higher performance can be achieved.

Accordingly, the present invention provides effective functions for a system needing a turbo decoder.

In the above embodiment, separate interleavers and recovering interleaver are employed in the turbo decoder. However, these are all aimed at implementing permutation in accordance with the same rule, so a configuration in which these components are combined into a single unit will be described as the third embodiment, hereinbelow.

Figure 5:
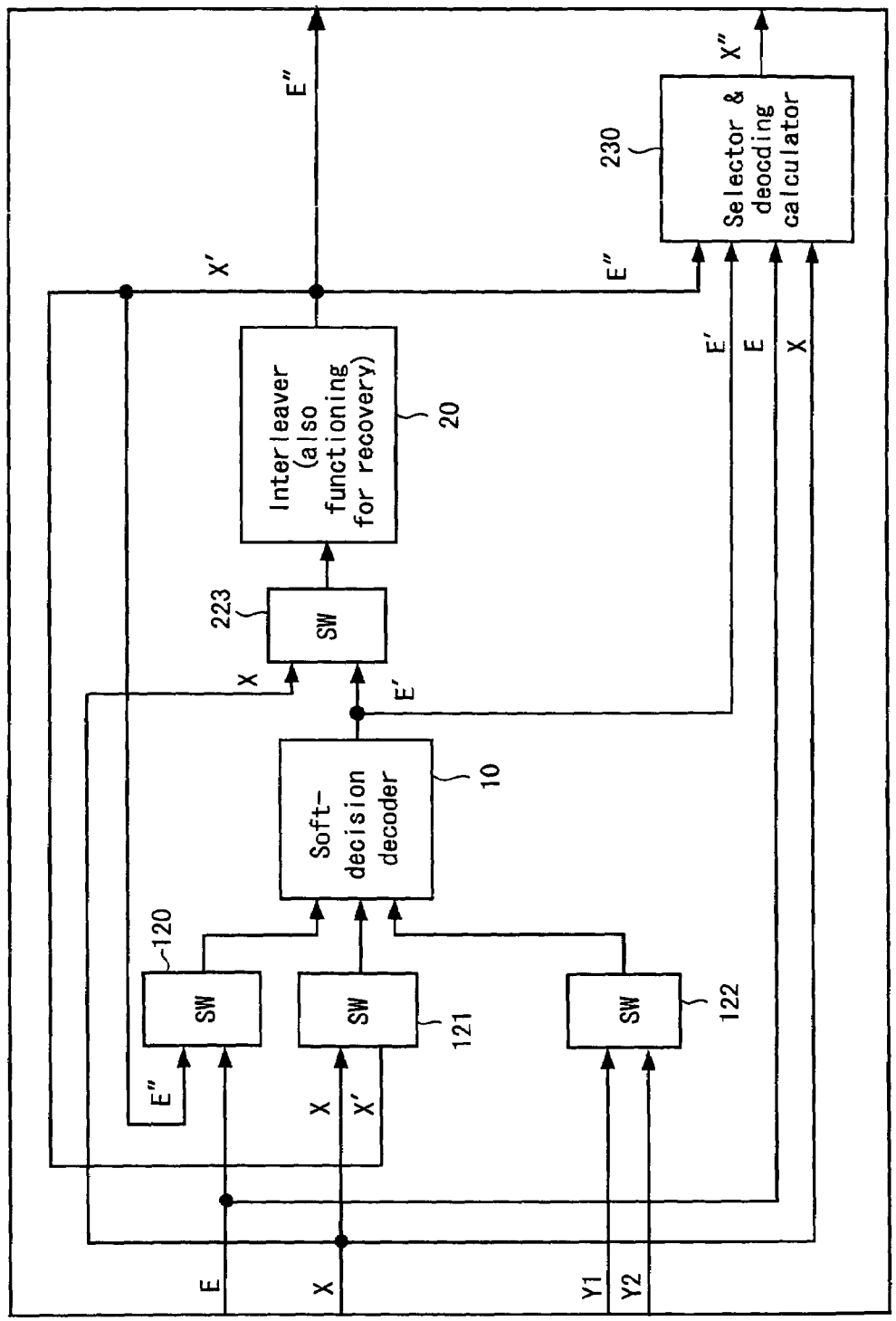
FIG. 5 is a block diagram showing a turbo decoder in accordance with the third embodiment of the present invention.

Referring to FIG. 5, the third embodiment of the present invention will be described. Here, the same components as those described above are allotted with the same reference numerals and description is omitted.

Figure 4:
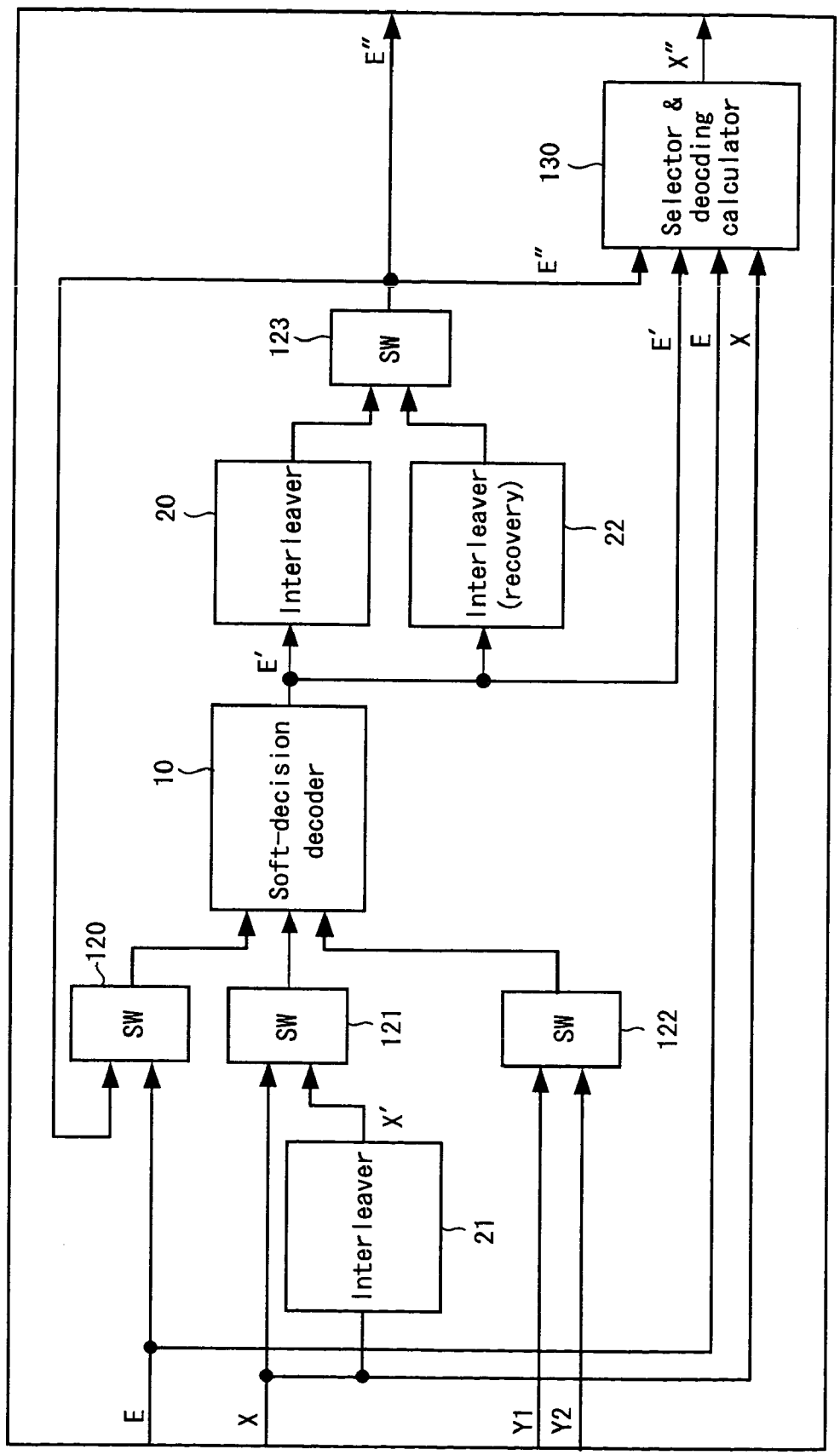
FIG. 4 is a block diagram showing a turbo decoder in accordance with the second embodiment of the present invention.

This embodiment is configured based on the configuration of the second embodiment shown in FIG. 4, wherein interleaver 21 and de-interleaver 22 are combined into interleaver 20 while SW123 is removed and a new input signal selecting means (SW)223 is added so that it is serially connected to the output from soft-decision decoder 10.

Since interleaver 20 also provides the function of interleaver 21 for interleaving received signal X, received signal X is input to interleaver 20 through SW223 and a permuted version X' is supplied to SW121.

Further, the output likelihood information E" from interleaver 20 (as a recovering interleaver), the output likelihood information E' from soft-decision decoder 10, likelihood information E from external source and information bits X are input to selector and decoding calculator 230, so that the calculator can implement decoding, appropriately, using the inputs.

In the first half of the decoding in each iterative process, SW120 selects likelihood information E from the likelihood information E and E" and outputs it. SW121 selects X from received information X and X' and outputs it. SW122 selects Y1 from the parity information Y1 and Y2 and outputs it.

As a result, likelihood information E from external source and information bits X and Y1 from external source are used in soft-decision decoder 10. By way of SW223, the output likelihood information E' is permuted by interleaver 20 and then is output as likelihood information E".

In the second half of the decoding in each iterative process, SW120 selects E" from the likelihood information E and E" and outputs it. SW121 selects X' from received information X and X'. SW122 selects Y2 from parity information Y1 and Y2.

As a result, likelihood information E" form external source and information bits X' and Y2 from external source are used in soft-decision decoder 10. By way of SW223, the output likelihood information E' is rearranged by interleaver 20 to the original order and then is output as likelihood information E".

With the above arrangement, the value (Lc·X+E'+E"), determined based on likelihood information E' in the first half operation part and the output likelihood information E" from de-interleaver 20 in the second half decoding and the value (Lc·X+E+E'), determined based on the input information sequence E in the first half operation part 10 and the output likelihood information E' from the first half decoding can be obtained as the decoded results, from selector and decoding calculator 230, whereby it is possible to realize a turbo decoder of a more compact configuration, which is highly integrated, reduced in power consumption and of which fine iterative control can be made.

In the description of the above embodiment, the decoded result is obtained from the value (Lc·X+E'+E"), determined based on likelihood information E' in the first half operation part and the output likelihood information E" from de-interleaver 20 in the second half decoding and the value (Lc·X+E+E'), determined based on the input information sequence E in the first half operation part and the output likelihood information E' from the first half decoding. Next, an example in which the number of iterations is appropriately selected will be described as the fourth embodiment.

The fourth embodiment of the present invention will be described with reference to FIG. 6. Here, the same components as those described above are allotted with the same reference numerals and description is omitted.

Figure 6:
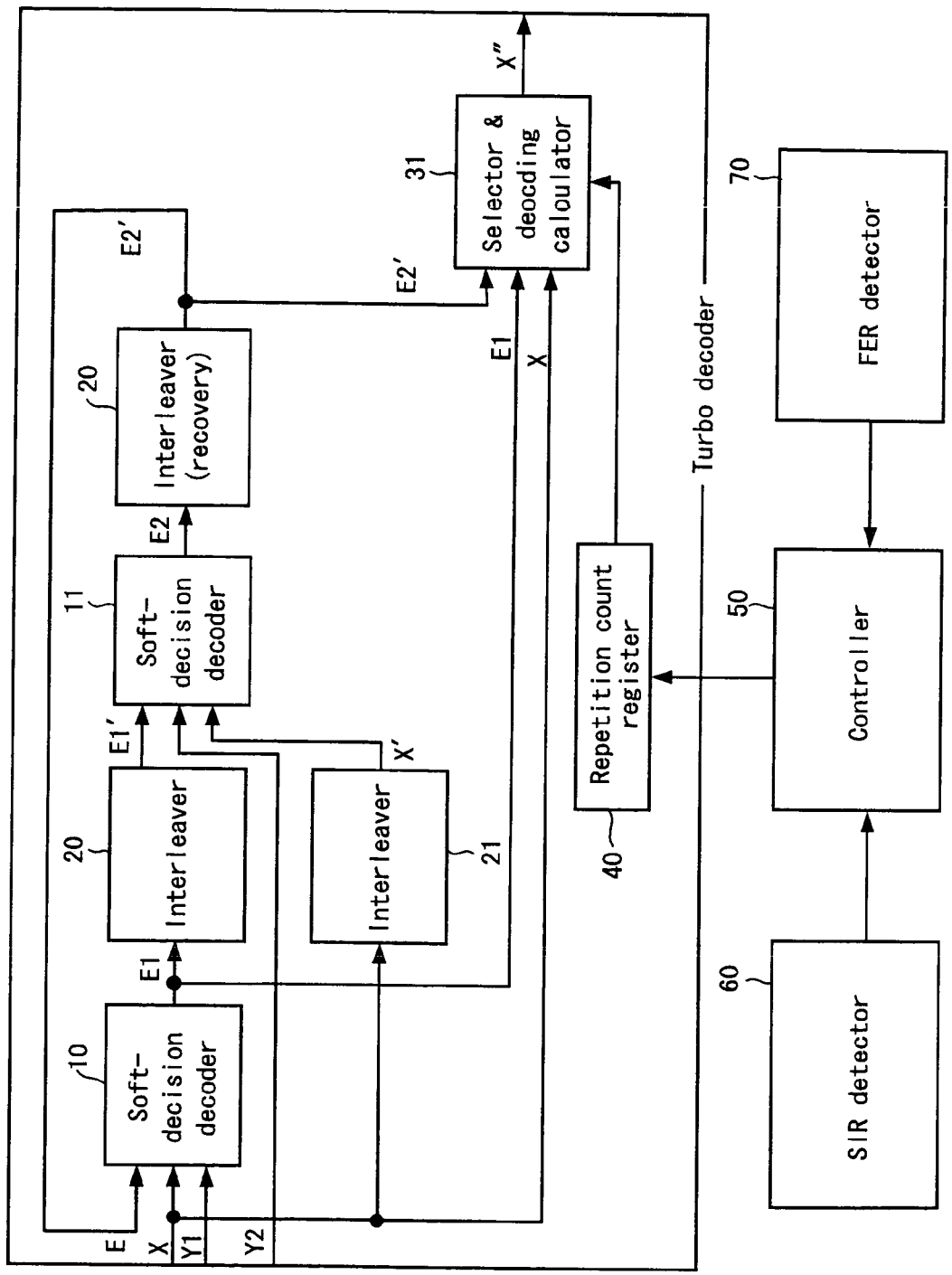
FIG. 6 is a block diagram showing a turbo decoder in accordance with the fourth embodiment of the present invention.

FIG. 6 shows a configuration where a repetition count register 40 is added to the configuration of the first embodiment shown in FIG. 1. A controller 50 calculates the number of iterations for achieving the desired error correction performance based on the measurements of a SIR detector 60 and a FER detector 70 and delivers the control signal representing the repetition count to repetition count register 40. This repetition count information is output to selector and decoding calculator 31.

Likelihood information E2' is used as the likelihood information E when iterations are repeated. This is explicitly shown by the feedback loop.

Repetition count register 40, in addition to the number of normal iterations, designates one of (Lc·X+E1+E2') and (Lc·X+E+E1), shown in the above first embodiment, to be used as the decoding calculation. This means makes it possible to select the number of iterations and the calculation scheme (Lc·X+E1+E2') or (Lc·X+E+E1), based on which the turbo decoding process is performed, whereby it is possible to control error correction performance in order to realize the necessary error correction characteristics.

The number of iterations, which controller 50 determines to be necessary based on the external factors acquired through SIR detector 60 or FER detector 70, is set into repetition count register 40.

For example, if a service having a target BER of $10^{-3}$ is switched over to a service having a target BER of $10^{-4}$ while the power is kept constant, it is possible to deal with such a translation by setting up an increased number of iterations.

As has been described heretofore, according to the present embodiment, since the number of iterations to realize the desired error correcting performance is automatically selected dependent on the external factors and the like by controller 50, optimal processing can be achieved. Here, the description of the above embodiment was made referring to an example where both the decoding calculations (Lc·X+E+E1) and (Lc·X+E1+E2') can be implemented, but it is not always necessary to implement both decoding calculations. For example, depending on the external factors etc., the process may, of course, be implemented based on the decoding calculation of (Lc·X+E+E1) only, with the half the cycle of the number of decoding calculations in the conventional configuration, to improve the decoding accuracy. This case will be described next as the fifth embodiment.

Figure 7:
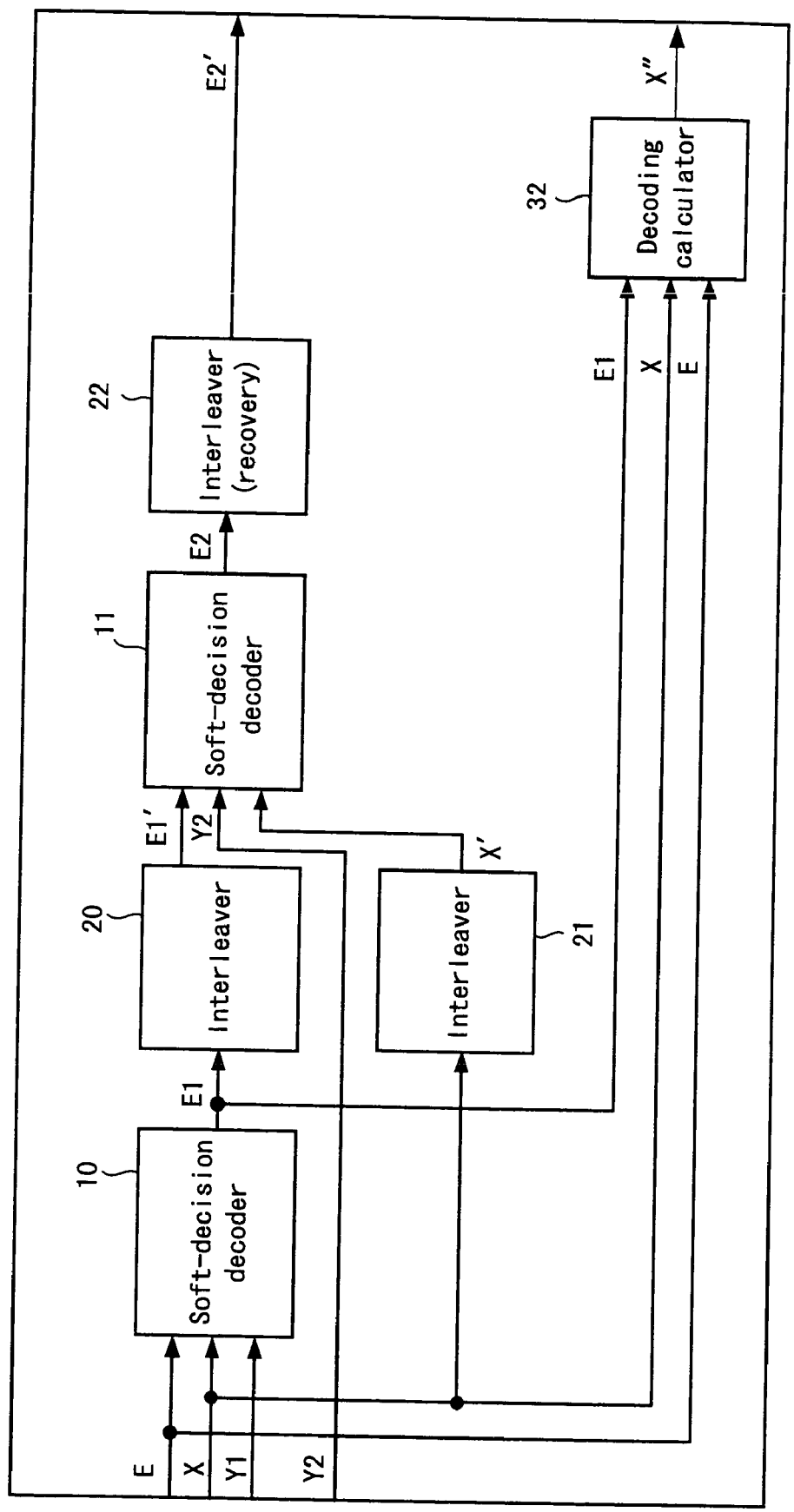
FIG. 7 is a block diagram showing a turbo decoder in accordance with the fifth embodiment of the present invention.

The fifth embodiment of the present invention will be described with reference to FIG. 7. Here, the same components as those described above are allotted with the same reference numerals and description is omitted.

In the present embodiment, only the decoding calculations of (Lc·X+E+E1) are repeated beforehand to enhance the decoding accuracy. Therefore, differing from the above embodiment, no switching to (Lc·X+E1+E2') is needed. Accordingly, in the configuration shown in FIG. 7, selector and decoding calculator 30 shown in FIG. 1 is replaced by a decoding calculator 32 to implement calculation of (Lc·X+ E+E1).

Figure 8:
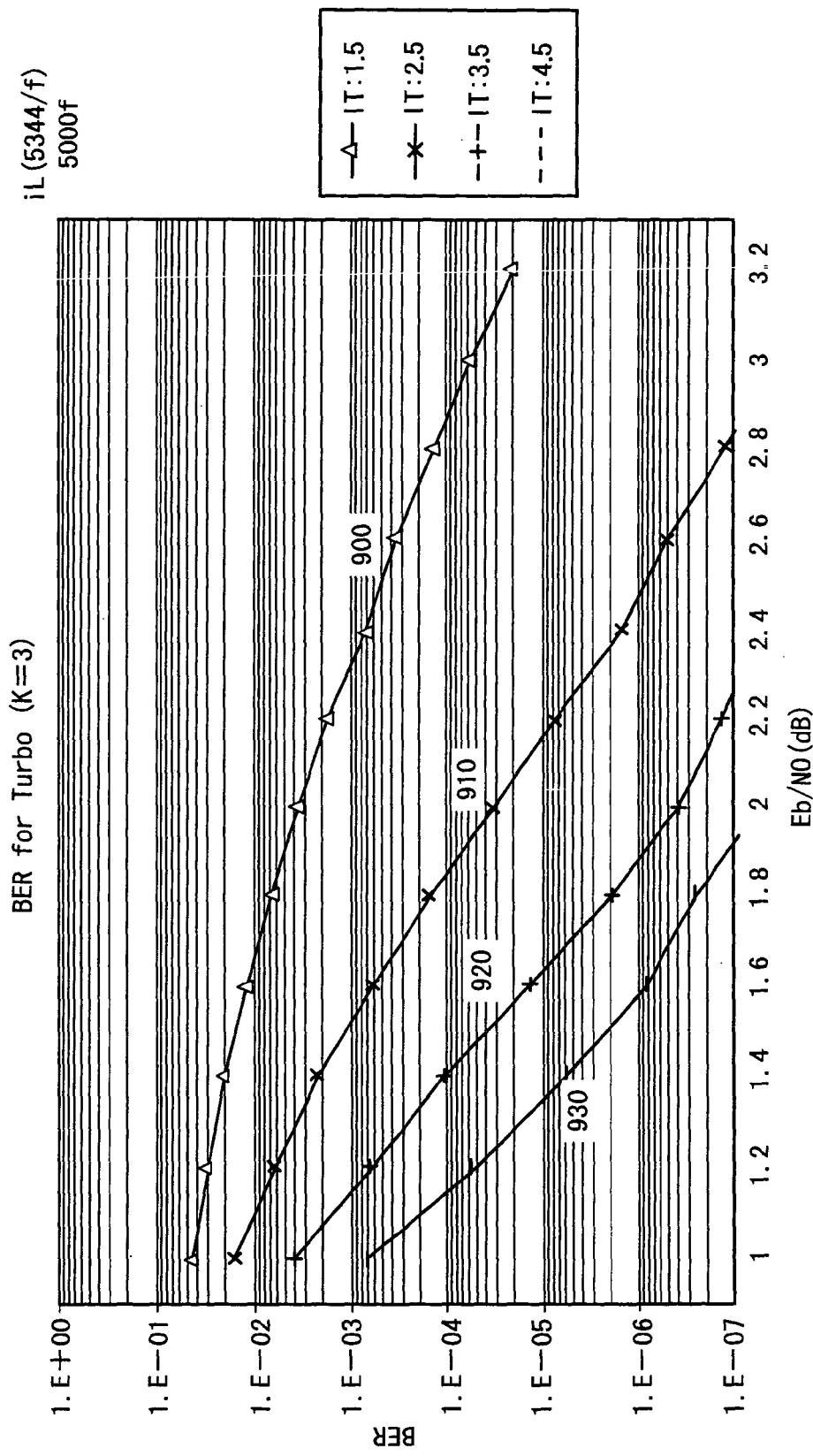
FIG. 8 is a BER characteristics chart of a turbo decoder in accordance with the fifth embodiment of the present invention.
Figure 18:
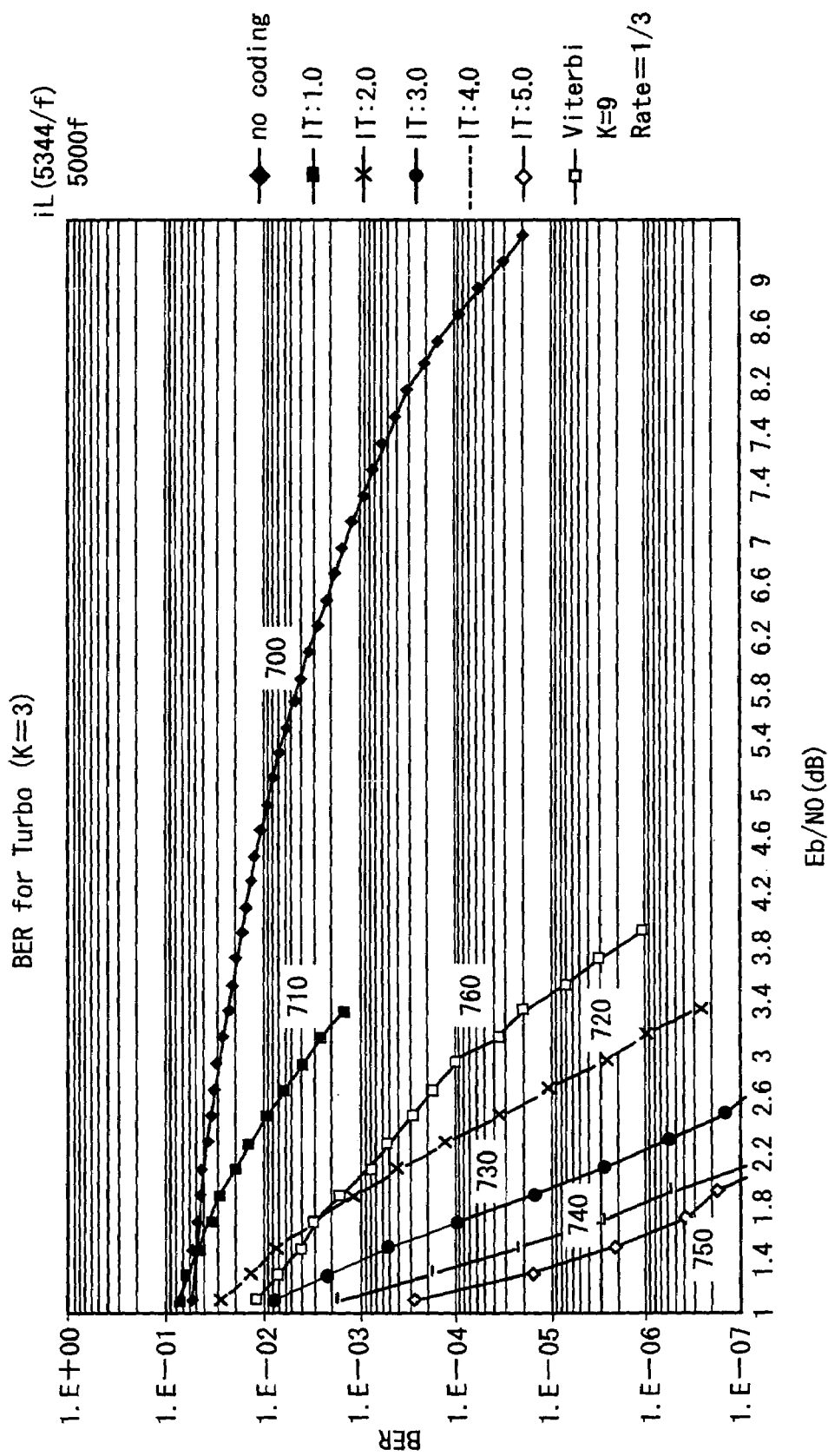
FIG. 18 is a BER characteristics chart of a conventional turbo decoder.

FIG. 8 shows error correction characteristics when the number of iterations, IT, of (Lc·X+E+E1), is set at 1.5 times, 2.5 times, 3.5 times and 4.5 times, and designated by numerals 900, 910, 920 and 930, respectively. It will be understood that the error correction characteristics presented in this case present different characteristics from those of the conventional example shown in FIG. 18.

In the technique utilizing (Lc·X+E+E1) as the decoding data, it is possible to adopt a configuration described in the second and third embodiments, in which a soft decision decoder is shared or a common interleaver is shared.

Alternatively, it is possible to implement the decoding of (Lc·X+E+E1) by fixing the manner of decoding, by the scheme of setting the number of iterations by repetition count register 40 as in the fifth embodiment.

Figure 9:
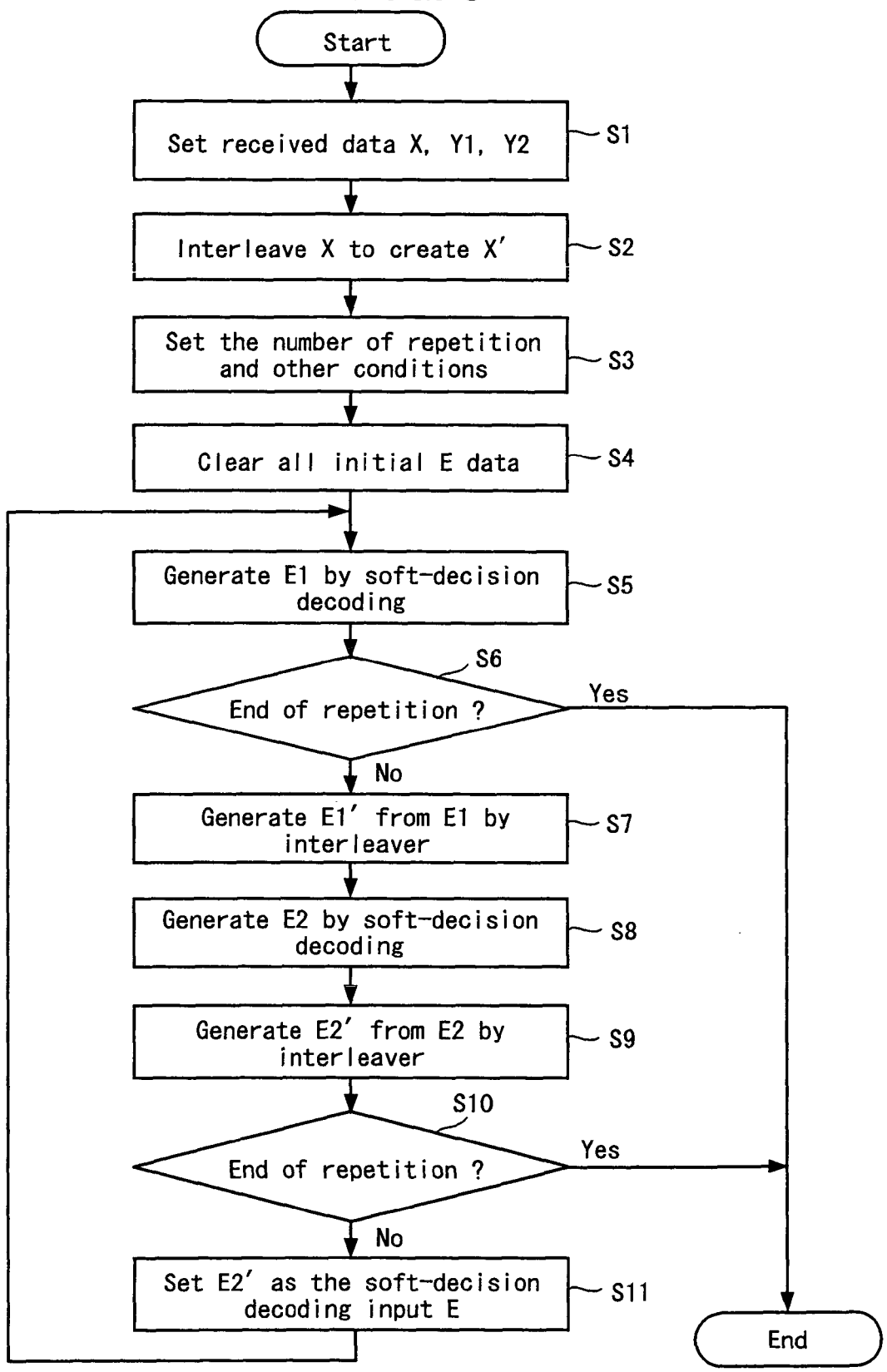
FIG. 9 is a flowchart showing the sequence of operations when a turbo decoder according to the first embodiment of the present invention is implemented by software.

The configuration of the present invention can be realized by a control means such as a DSP, CPU or the like with a storage device in which the programs are installed. FIG. 9 shows the processing sequence of realizing the configuration of the first embodiment by software. Here, examples of the storage device include semiconductor memories such as RAMs, ROMs and the like and rotating storage media such as compact disks, magnetic disks, photo disks, magneto-optical disks, magnetic tape and the like.

To begin with, received data X, Y1 and Y2 are set up (S1) and the received data X is interleaved to create X' (S2).

Next, the number of repetitions and other conditions are set (S3). All pieces of initial likelihood information E are set at 0 (S4). Next, based on the received data X, Y1 and likelihood information E(=0), a soft-decision decoding process is implemented to generate likelihood information E1 (S5).

At Step S6, the number of repetitions and other conditions, set at the above step S3, are checked, and when the current state meets the number of repetitions and other conditions, the decoding process is ended and operation of (Lc·X+E+E1) is implemented so as to obtain decoded data (S6). If the conditions are not satisfied, the operation goes to Step S7 so that interleaving of likelihood information E1 is implemented to generate likelihood information E1' (S7).

Next, based on the interleaved version X' of the received data X, received data Y1 and likelihood information E1', a soft-decision decoding process are implemented to generate likelihood information E2 (S8).

Subsequently, likelihood information E2 is subjected to a recovering interleaving process to generate likelihood information E2' (S9). Then, the number of repetitions and other conditions, set at the above step S3, are checked again. When the current state does not meet the conditions, the likelihood information E2' is replaced by likelihood information E (S11) and then the operation goes to Step S5 to repeat the same sequence. If the current state meets the number of repetitions and other conditions, the decoding process is ended and operation of (Lc·X+E1+E2') is implemented so as to obtain the decoded data.

For the above embodiments, preferred examples of the present invention have been described. But, of course, the present invention should not be limited to these.

For example, in the present embodiments, the turbo encoder side is composed of two RSC encoders 400 and 410 and one interleaver 420, the turbo decoder side is adapted to employ two soft-decision decoders or one common decoder and three interleavers, or one or two common interleavers as appropriate and as required. However, if more RSC encoders with an increased number of interleavers 420 are used on the turbo encoder side, soft-decision decoding should be implemented a more number of times proportionally to the number of the RSC encoders, hence an increased number of soft-decision decoders are employed or a necessary number of decoders are adapted to be shared as appropriate. Similarly, the number of interleaving processes also increases, so that the number of interleavers should be increased as appropriate as the number of RSC encoders (interleavers) increases.

As has been described heretofore, according to the present invention, it is possible to improve error correction characteristics while suppressing increase in the amount of processing or enlargement of the circuit scale. As a result, compared to the conventional configuration, a higher integration, hence reduced power consumption can be realized if equivalent error characteristics are demanded. If equivalent circuit scales are expected, error correction of a higher performance can be achieved.

Accordingly, the present invention is effectively applied to a system needing a turbo decoder.

INDUSTRIAL APPLICABILITY

As has been described heretofore, the turbo decoder of the present invention, its method and its storage medium storing the method are suitable for decoders in a mobile communication system using turbo codes and its decoding method, and is able to improve error correction characteristics while suppressing increase in the amount of processing or enlargement of the circuit scale.

The invention claimed is:

1. A turbo decoder which receives an information signal, a first additional signal and a second additional signal, the turbo decoder generating previous likelihood data for decoded data obtained by decoding the information signal and iteratively decoding the information signal based on the previous likelihood data, the turbo decoder comprising:
a first soft-decision decoding portion which implements a first soft-decision decoding process of the information signal based on the first additional signal and the previous likelihood data, to output first likelihood data;
a first interleaver for permuting the first likelihood data in accordance with a predetermined rule and outputting permuted first likelihood data;
a second interleaver for permuting the information signal in accordance with the predetermined rule and outputting a permuted information signal;
a second soft-decision decoding portion which implements a second soft-decision decoding process of the information signal based on the permuted information signal, the second additional signal and the permuted first likelihood data, to output second likelihood data;
a third interleaver for permuting the second likelihood data in accordance with a predetermined rule and outputting permuted second likelihood data; and
a decoding calculator which, based on the first likelihood data and the permuted second likelihood data, implements a decoding process of the information signal to output decoded data,
wherein the decoding calculator is configured to also implement a decoding process of the information signal based on the previous likelihood data and the first likelihood data.

2. The turbo decoder according to claim 1, wherein the permuted second likelihood data is used as the previous likelihood data for a subsequent process in the first decoding portion.

3. The turbo decoder according to claim 1, wherein the first soft-decision decoding portion is also used as the second soft-decision decoding portion.

4. The turbo decoder according to claim 1, wherein one interleaver is configured to serve as two or three of the first, second and third interleavers.

5. The turbo decoder according to claim 1, further comprising:
a repetition count setter for setting the number of decoding processes to be repeated, wherein the decoding calculator outputs the decoded data of the information signal, after repeating the decoding processes the number of repetitions designated by the repetition count setter.

6. A turbo decoding method which receives an information signal, a first additional signal and a second additional signal, the turbo decoder generating previous likelihood data for decoded data obtained by decoding the information signal and iteratively decoding the information signal based on the previous likelihood data, the method comprising:
a first soft-decision decoding step of implementing a first soft-decision decoding process of the information signal based on the first additional signal and the previous likelihood data, to output first likelihood data;
a first permuting step of permuting the first likelihood data in accordance with a predetermined rule and outputting permuted first likelihood data;
a second permuting step of permuting the information signal in accordance with the predetermined rule and outputting a permuted information signal;
a second soft-decision decoding step of implementing a second soft-decision decoding process of the information signal based on the permuted information signal, the second additional signal and the permuted first likelihood data, to output second likelihood data;
a third permuting step of permuting the second likelihood data and outputting permuted second likelihood data; and
a decoding and calculating step of implementing a decoding process of the information signal to output decoded data, based on the previous likelihood data and the first likelihood data.

7. A storage medium on which computer-executable instructions for the turbo decoding method according to claim 6 are stored.

8. A turbo decoder comprising:
a first soft-decision decoder for providing first likelihood data based on an information signal and previous likelihood data previously generated by the turbo decoder;
a first interleaver for permuting the first likelihood data and outputting permuted first likelihood data;
a second interleaver for permuting the information signal and outputting a permuted information signal;
a second soft-decision decoder for providing second likelihood data based on the permuted first likelihood data and the permuted information signal;
a third interleaver for permuting the second likelihood data and outputting permuted second likelihood data; and
a decoding calculator for providing a decoded information signal based on the previous likelihood data and the first likelihood data.

9. The turbo decoder according to claim 8, wherein the permuted second likelihood data is used as the previous likelihood data.

10. The turbo decoder according to claim 8, wherein the first soft-decision decoding portion and the second soft-decision decoding portion are embodied in the same decoder circuit.

11. The turbo decoder according to claim 8, wherein a single interleaving circuit is configured to operate as two or more of the first, second and third interleavers.

* * * * *